United States Patent [19]
Unami

[11] Patent Number: 5,912,600
[45] Date of Patent: *Jun. 15, 1999

[54] PIEZOELECTRIC RESONATOR AND ELECTRONIC COMPONENT CONTAINING SAME

[75] Inventor: Toshihiko Unami, Omihachiman, Japan

[73] Assignee: Murata Manufacturing Co., Ltd., Kyoto-fu, Japan

[*] Notice: This patent is subject to a terminal disclaimer.

[21] Appl. No.: 08/845,954

[22] Filed: Apr. 30, 1997

[30] Foreign Application Priority Data

Aug. 27, 1996 [JP] Japan .................................. 8-245551
Feb. 5, 1997 [JP] Japan .................................. 9-38349

[51] Int. Cl.$^6$ ........................... H03H 9/205; H03H 9/10; H03H 9/54
[52] U.S. Cl. ..................... 333/187; 333/189; 310/321; 310/348; 310/357; 310/366
[58] Field of Search ................. 333/186–192; 310/311, 321, 328, 357, 359, 366, 348

[56] References Cited

U.S. PATENT DOCUMENTS

| | | | |
|---|---|---|---|
| 2,157,665 | 5/1939 | Hollmann | 310/315 |
| 3,185,869 | 5/1965 | Shoor | 310/315 |
| 3,297,889 | 1/1967 | Breskend | 310/315 |
| 3,401,275 | 9/1968 | Curran et al. | |
| 3,590,287 | 6/1971 | Berlincourt et al. | 310/366 X |
| 4,087,716 | 5/1978 | Haywang | 310/359 X |
| 4,360,754 | 11/1982 | Toyoshima et al. | 310/366 |
| 4,398,117 | 8/1983 | St. Cyr | 310/348 |
| 4,503,352 | 3/1985 | Inoue | 333/187 X |
| 4,532,451 | 7/1985 | Inoue | 310/348 X |
| 4,542,315 | 9/1985 | Yamamoto et al. | 310/348 |
| 4,564,782 | 1/1986 | Ogawa | 333/191 X |
| 4,570,098 | 2/1986 | Tomita et al. | 310/346 |
| 4,633,120 | 12/1986 | Sato et al. | 310/328 |
| 4,642,510 | 2/1987 | Yamashita | 310/348 |
| 4,656,385 | 4/1987 | Tanaka | 310/348 |
| 4,752,712 | 6/1988 | Tomita et al. | 310/328 |
| 4,759,107 | 7/1988 | Ogawa et al. | 310/366 X |
| 4,780,639 | 10/1988 | Shirasu | 310/328 |
| 4,885,498 | 12/1989 | Wakita | 310/328 |
| 5,045,744 | 9/1991 | Ando et al. | 310/359 X |
| 5,118,982 | 6/1992 | Inoue et al. | 310/328 X |
| 5,126,618 | 6/1992 | Takahashi et al. | 310/346 |
| 5,153,477 | 10/1992 | Jomura et al. | 310/366 X |
| 5,225,731 | 7/1993 | Owen | 310/366 |
| 5,233,256 | 8/1993 | Hayashi et al. | 310/317 |
| 5,237,239 | 8/1993 | Inoue et al. | 310/328 |
| 5,241,236 | 8/1993 | Sasaki et al. | 310/358 |
| 5,250,870 | 10/1993 | Fenlon et al. | 310/345 |
| 5,381,067 | 1/1995 | Greenstein | 310/359 X |
| 5,438,232 | 8/1995 | Inoue et al. | 310/328 |
| 5,446,485 | 8/1995 | Usui | 347/72 |
| 5,517,073 | 5/1996 | Ohkuma | 310/315 |
| 5,523,645 | 6/1996 | Inoi | 310/328 X |
| 5,525,944 | 6/1996 | Oyama | 333/189 |
| 5,548,179 | 8/1996 | Kaida | 310/367 |
| 5,565,824 | 10/1996 | Nagano | 333/189 |
| 5,572,082 | 11/1996 | Sokol | 310/366 |
| 5,585,687 | 12/1996 | Wakabayashi et al. | 310/366 |
| 5,596,243 | 1/1997 | Tsuru et al. | 310/348 |
| 5,596,244 | 1/1997 | Kugou et al. | 310/348 |
| 5,696,472 | 12/1997 | Kaida | 333/189 |
| 5,705,880 | 1/1998 | Shimura et al. | 310/366 |
| 5,717,365 | 2/1998 | Kaida et al. | 333/187 |

FOREIGN PATENT DOCUMENTS 5-160459  6/1993  Japan ................................. 310/366

*Primary Examiner*—Robert Pascal
*Assistant Examiner*—Barbara Summons
*Attorney, Agent, or Firm*—Graham & James LLP

[57] ABSTRACT

A piezoelectric resonator has a substantially rectangular-parallelpiped-shaped base member. The base member includes laminated piezoelectric layers which are polarized in the longitudinal direction of the base member such that the directions of polarization differ at adjacent piezoelectric layers. Internal electrodes are disposed between the piezoelectric layers. The internal electrodes each preferably comprise a plurality stripes dispose on main surfaces of the piezoelectric layers. On opposing side surfaces of the base member, the internal electrodes are alternately covered by at least two insulating films. The at least two insulating films cover different internal electrodes. External electrodes are disposed on the opposing side surfaces of the base member and are connected to internal electrodes.

20 Claims, 21 Drawing Sheets c = n · d ( n : NATURAL NUMBER )

PIEZOELECTRIC RESONATOR AND ELECTRONIC COMPONENT CONTAINING SAME

BACKGROUND OF THE INVENTION

1. Field of the Invention

The present invention relates to novel piezoelectric resonators and electronic components containing the same, and more particularly, to a novel piezoelectric resonator which maximizes the effective use of the mechanical resonance of a piezoelectric member, and electronic components containing such a novel piezoelectric resonator, such as an oscillator, a discriminator, and a filter.

2. Description of the Related Art

FIG. 38 is a perspective view of a conventional piezoelectric resonator. A piezoelectric resonator 1 includes a single piezoelectric substrate 2 having, for example, a rectangular plate shape as viewed from above. The single piezoelectric substrate 2 is polarized in the thickness direction. On two opposite major surfaces of the single piezoelectric substrate 2, electrodes 3 are provided. When a signal is input between the electrodes 3, an electrical field is applied to the single piezoelectric substrate 2 in the thickness direction and the single piezoelectric substrate 2 vibrates in the longitudinal direction. In FIG. 39, there is shown a piezoelectric resonator 1 in which electrodes 3 are provided on two opposite major surfaces of a single piezoelectric substrate 2 having a square plate shape as viewed from above. The single piezoelectric substrate 2 of the piezoelectric resonator 1 is polarized in the thickness direction. When a signal is input between the electrodes 3 in the piezoelectric resonator 1, an electrical field is applied to the single piezoelectric substrate 2 in the thickness direction and the single piezoelectric substrate 2 vibrates in a square-type vibration mode (in the plane direction).

These piezoelectric resonators shown in FIGS. 38 and 39 are unstiffened type resonators, in which the vibration direction differs from the direction of polarization and the electrical field direction. The electromechanical coupling coefficient of such an unstiffened piezoelectric resonator is lower than that of a stiffened piezoelectric resonator in which each of the vibration direction, the direction of polarization, and the direction in which an electrical field is applied are the same.

An unstiffened piezoelectric resonator has a relatively small frequency difference ΔF between the resonant frequency and the anti-resonant frequency. This leads to a drawback in which a frequency-band width in use is narrow when an unstiffened frequency resonator is used as an oscillator or a filter. Therefore, the degree of freedom and flexibility in resonator characteristics design is limited in such a piezoelectric resonator and electronic components including such resonators.

The piezoelectric resonator shown in FIG. 38 uses the first-order resonance in the longitudinal mode. Because of its structure, the piezoelectric resonator of FIG. 38 also generates large spurious resonances in odd-number-order harmonic modes, such as the third-order and fifth-order modes, and in a width mode. To suppress these spurious resonances, some solutions have been considered, such as polishing, increasing mass, and changing the shape of the electrode. These solutions increase manufacturing cost.

In addition, since the single piezoelectric substrate has a rectangular plate shape, the single substrate cannot be made thinner without sacrificing required strength. Therefore, the distance between the electrodes cannot be reduced and a capacitance between terminals cannot be increased. This makes it extremely difficult to achieve impedance matching with an external circuit. To form a ladder filter by alternately connecting a plurality of piezoelectric resonators in series and in parallel, the capacitance ratio of the series resonator to the parallel resonator needs to be made large in order to increase attenuation. Because a piezoelectric resonator has the shape and structural restrictions described above, however, large attenuation cannot be obtained.

In the piezoelectric resonator shown in FIG. 39, large spurious resonances such as those in the thickness mode and in the triple-wave mode in the plane direction are generated. Since the piezoelectric resonator must have a large size as compared with a piezoelectric resonator using the longitudinal vibration in order to obtain the same resonant frequency, it is difficult to reduce the size of the piezoelectric resonator shown in FIG. 39. When a ladder filter is formed by a plurality of piezoelectric resonators, in order to increase the capacitance ratio between the series resonator and the parallel resonator, the resonators connected in series must have an increased thickness and electrodes are formed only on part of a piezoelectric substrate to make the capacitance small. In this case, since the electrodes are only partially formed, the difference ΔF between the resonant frequency and the anti-resonant frequency as well as the capacitance is reduced. The resonators connected in parallel are accordingly required to have small ΔF. As a result, the piezoelectricity of the piezoelectric substrate is not effectively used, and the transmission band width of the filter cannot be increased.

The inventors developed a piezoelectric resonator having small spurious resonance and a large difference ΔF between the resonant frequency and the antiresonant frequency. In such a piezoelectric resonator, a plurality of piezoelectric layers and a plurality of electrodes are alternately laminated to a base member, and the plurality of piezoelectric layers are polarized in the longitudinal direction of the base member. This laminated piezoelectric resonator is a stiffened type resonator, and the piezoelectric layers are arranged such that the vibration direction, the direction of polarization, and the direction in which an electric field is applied are the same. Therefore, as compared with an unstiffened piezoelectric resonator, in which the vibration direction differs from the direction of polarization and electric field, the stiffened piezoelectric resonator has a larger electromechanical coupling coefficient and a larger frequency difference ΔF between the resonant frequency and the antiresonant frequency. In addition, vibrations in modes such as the width and thickness modes, which are different from the basic vibration, are unlikely to occur in a stiffened piezoelectric resonator.

Since in a piezoelectric resonator having this lamination structure, each electrode is formed to cover an entire area of a surface of a respective one of the piezoelectric layers, which surface extends substantially perpendicular to the longitudinal direction of the base member, it is necessary to change distances between electrodes and the number of electrodes to set ΔF to a desired value. Changing distances between electrodes and the number of electrodes is difficult and increases the time and expense required for manufacturing such resonators.

SUMMARY OF THE INVENTION

To overcome the problems described above, the preferred embodiments of the present invention provide a piezoelectric resonator having a high degree of freedom and flexibility in resonator characteristics design to allow the difference ΔF between the resonant frequency and the antiresonant frequency to be set to a desired value without having to change distances between electrodes or the number of electrodes, and to provide an electronic component containing the novel piezoelectric resonator.

According to one preferred embodiment of the present invention, a piezoelectric resonator comprises a base member, the base member including a plurality of laminated piezoelectric layers; and a plurality of electrodes disposed substantially perpendicularly to a longitudinal direction of the base member and spaced at intervals in the longitudinal direction of the base member, the plurality of electrodes being disposed on surfaces of the piezoelectric layers which are substantially perpendicular to the longitudinal direction of the base member; wherein the plurality of piezoelectric layers are polarized in the longitudinal direction of the base member, at least some of the plurality of electrodes are formed partially on the respective surfaces of the piezoelectric layers which are substantially perpendicular to the longitudinal direction of the base member layers, and an AC electric field is applied in the longitudinal direction of the base member to each of the piezoelectric layers via the plurality of electrodes such that longitudinal basic vibration is generated in the base member.

In the piezoelectric resonator, the electrodes formed partially on respective surfaces of the piezoelectric layers which are substantially perpendicular to the longitudinal direction of the base member may be formed in stripes on the surface of the piezoelectric layers.

The piezoelectric resonator may be formed such that alternate layers of the plurality of electrodes comprise stripes disposed on surfaces of the piezoelectric layers which surfaces are substantially perpendicular to the longitudinal direction of the base member, and the other alternate layers of the plurality of electrodes are formed so as to cover entire areas of surfaces of the piezoelectric layers which are substantially perpendicular to the longitudinal direction of the base member.

The piezoelectric resonator according to the preferred embodiments of the present invention may further include a support member, and a mounting member disposed between the support member and a center section of the base member in the longitudinal direction.

According to another preferred embodiment of the present invention, an electronic component comprises the above-described novel piezoelectric resonator, wherein the support member includes an insulating substrate on which a pattern electrode is disposed; the base member of the piezoelectric resonator is mounted on the insulating substrate via the mounting member; and a cap is disposed on the insulating substrate so as to cover the base member.

According to still another preferred embodiment of the present invention, an electronic component containing a plurality of the above-described novel piezoelectric resonators including a plurality of base members, wherein the support member includes an insulating substrate on which a pattern electrode is disposed; the plurality of the base members mounted on the insulating substrate through mounting members so as to define a ladder filter; and a cap is disposed on the insulating substrate so as to cover the base members.

The piezoelectric resonator according to the preferred embodiments of the present invention is a stiffened type resonator, and has piezoelectric layers in which the vibration direction, the direction of polarization, and the direction in which an electric field is applied are the same. Therefore, as compared with an unstiffened piezoelectric resonator, in which the vibration direction differs from the direction of polarization and electric field, the stiffened piezoelectric resonator has a larger electromechanical coupling coefficient and a larger frequency difference ΔF between the resonant frequency and the antiresonant frequency. In addition, vibrations in modes such as the width and thickness modes, which are different from longitudinal vibration, are unlikely to occur in the stiffened piezoelectric resonator.

In a piezoelectric resonator according to the preferred embodiments of the present invention, since at least some of the plurality of electrodes are only partially formed on surfaces of the piezoelectric layers which are substantially perpendicular to the longitudinal direction of the base member the overlapping area of the opposing portions of adjacent electrodes as seen from the direction perpendicular to the electrodes can be changed and ΔF is thereby easily adjusted. This leads to a high degree of freedom and flexibility in resonator characteristics design.

When electronic components such as an oscillator, a discriminator, and a filter are made using a piezoelectric resonator according to the preferred embodiments of the present invention, the piezoelectric resonator is mounted on an insulating substrate on which pattern electrodes are disposed and is covered by a cap to form chip-type, surface-mountable electronic components.

According to the preferred embodiments of the present invention, because the difference ΔF between the resonant frequency and the antiresonant frequency is large as compared with that of a conventional piezoelectric resonator, a wide-frequency-band piezoelectric resonator is obtained. In addition, a piezoelectric resonator according to the preferred embodiments of the present invention is unlikely to generate vibrations in modes other than the basic vibration mode and achieves superior resonator characteristics. Furthermore, ΔF can be set to the desired value without changing distances between electrodes and the number of electrodes in a piezoelectric resonator according to the preferred embodiments of the present invention. This leads to a high degree of freedom and flexibility in resonator characteristics design.

Since a chip-type electronic component can be made using the novel piezoelectric resonator, it is easy to mount the component on a circuit board.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
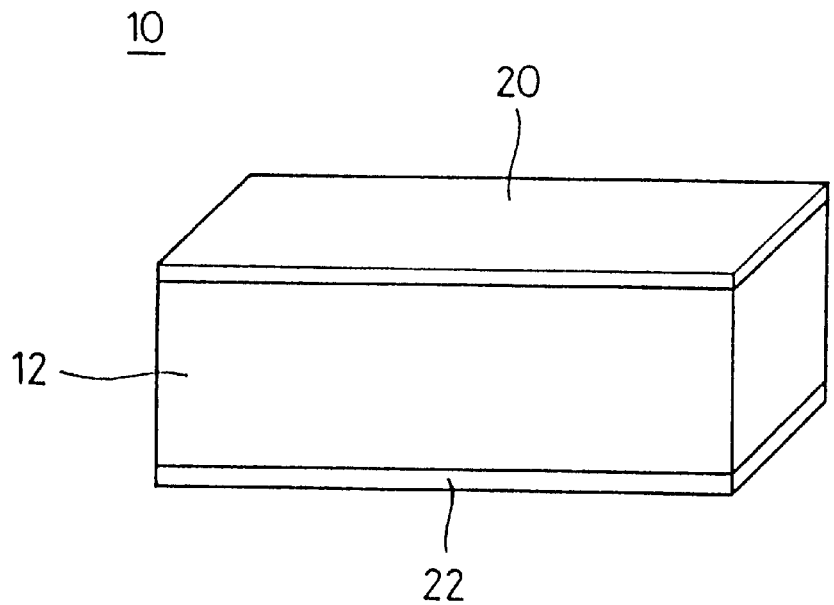
FIG. 1 is a perspective view of a piezoelectric resonator according to the preferred embodiments of the present invention.
Figure 2:
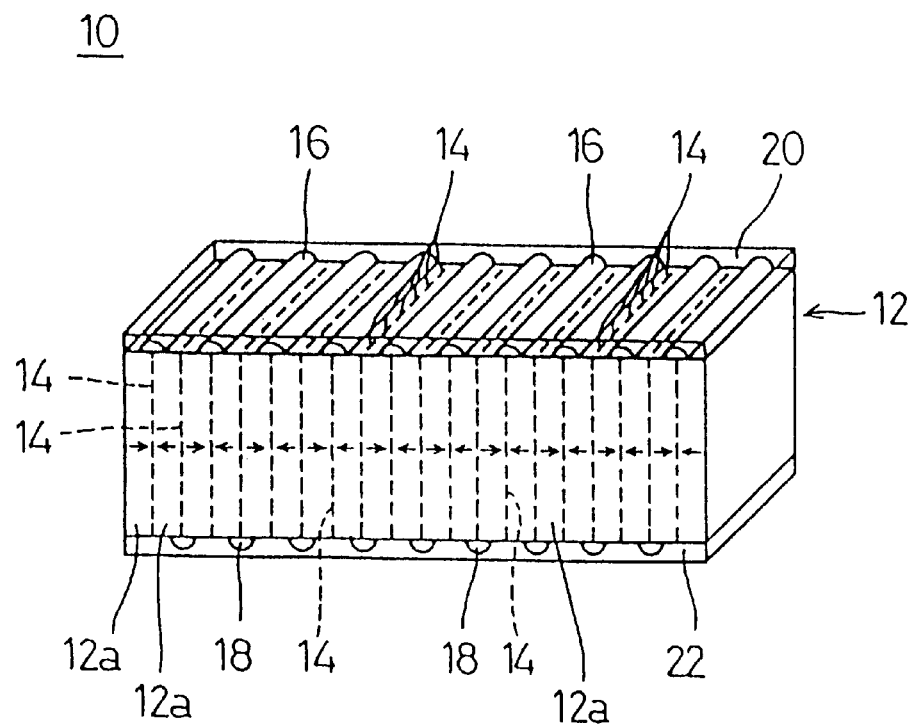
FIG. 2 is a view showing the structure of the piezoelectric resonator shown in FIG. 1.

FIG. 1 is a perspective view of a piezoelectric resonator according to a preferred embodiment of the present invention. FIG. 2 shows the internal structure of the piezoelectric resonator. The piezoelectric resonator 10 shown in FIGS. 1 and 2 preferably includes a substantially rectangular-parallelpiped-shaped base member 12. The base member 12 includes 20 laminated piezoelectric layers 12a made from, for example, piezoelectric ceramic. Each of these piezoelectric layers 12a preferably has the same dimensions. The piezoelectric layers 12a are polarized such that adjacent layers have opposite directions of polarization as shown by arrows in FIG. 2.

Figure 3:
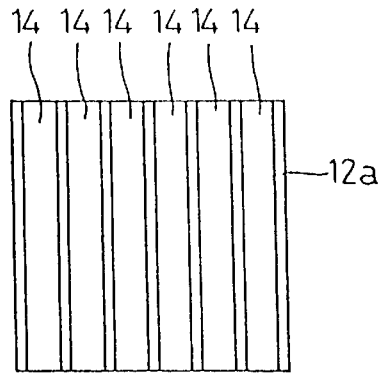
FIG. 3 is a plan showing electrodes used in the piezoelectric resonator shown in FIG. 1.

Electrodes 14 are disposed between the 20 piezoelectric layers 12a in the base member 12. As shown in FIG. 3, the electrodes 14 may preferably comprise six stripes disposed on main surfaces of the piezoelectric layers 12a which surfaces are substantially perpendicular to the longitudinal direction of the base member 12. Although this preferred embodiment is described as having preferably six stripes, it can be readily understood that any number of stripes can be provided on the surfaces of the piezoelectric layers 12a in accordance with the preferred embodiments of the present invention. The electrodes 14 extend, for example, in straight belt shapes between opposing sides of the piezoelectric layers 12a in the direction in which external electrodes 20 and 22 are disposed opposite to each other, which will be described later. These electrodes 14 are preferably disposed substantially perpendicularly to the longitudinal direction of the base member 12 and spaced at certain intervals in the longitudinal direction of the base member 12. The intervals between the electrodes 14 are preferably substantially equal to the dimensions of the corresponding piezoelectric layers 12a in the longitudinal direction of the base member 12.

On the opposing side surfaces of the base member 12, a plurality of insulating films 16 and 18 are disposed, respectively. On one side surface of the base member 12, the insulating film 16 covers the exposed end section of every other electrode 14. On the other side surface of the base member 12, the insulating film 18 covers the exposed end section of every other electrode 14 not covered by the insulating film 16 on the above-described side surface. The two side surfaces of the base member 12 on which the insulating films 16 and 18 are disposed serve as connection sections for connection to the external electrodes, which will be described later.

In these connection sections, namely, the side surfaces of the base member 12 on which the insulating films 16 and 18 are provided, external electrodes 20 and 22 are provided. The electrode 20 connects to electrodes 14 which are not covered by the insulating film 16, and the electrode 22 connects to electrodes 14 which are not covered by the insulating film 18. In other words, two adjacent electrodes 14 are connected to the electrodes 20 and 22, respectively.

A preferred method for manufacturing the piezoelectric resonator 10 will be described next.

Figure 4:
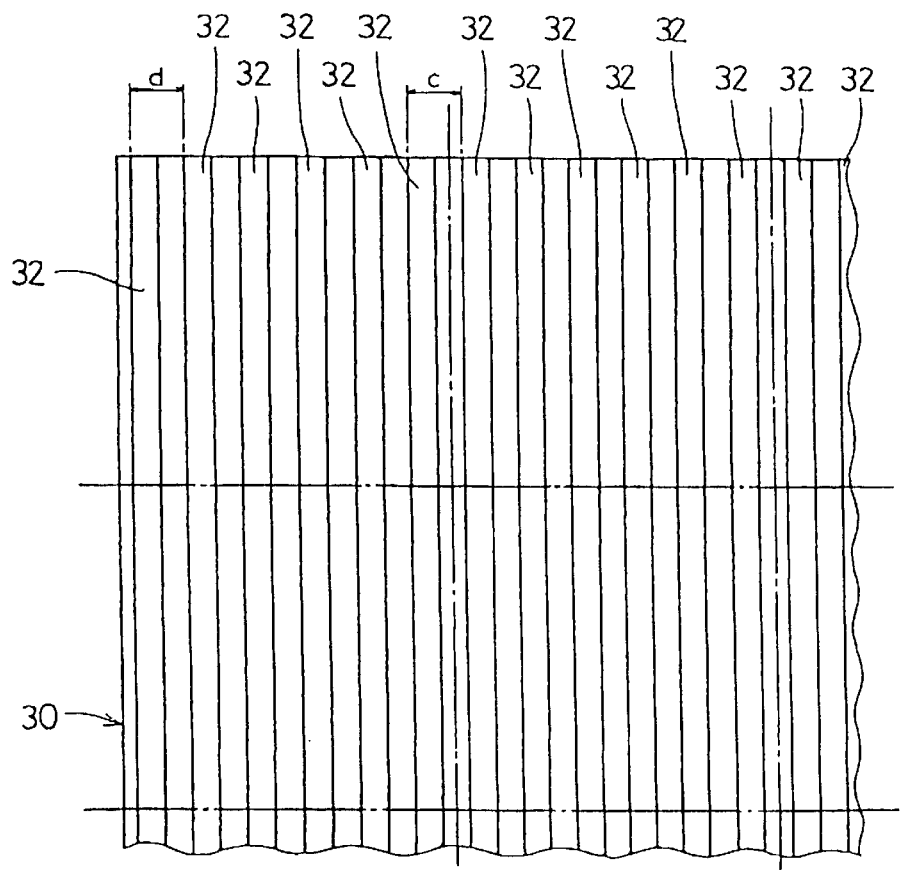
FIG. 4 is a view showing a mother board and electrodes comprising stripes both used for manufacturing the piezoelectric resonator shown in FIGS. 1 and 2.

A plurality of mother boards 30 preferably made from piezoelectric ceramic is prepared. On one main surface of each mother board 30, as shown in FIG. 4, electrodes 32 made from, for example, silver and palladium, are formed. Then, the plurality of mother boards 30 are laminated to complete a laminated member. Electrodes 32 are preferably not formed on the mother board 30 at a top surface thereof. The laminated member is cut along a line shown by short dashes shown in FIG. 4. Then, the insulating films 16 and 18 and the external electrodes 20 and 22 are formed on the mother board 30 to complete the piezoelectric resonator 10. The mother boards 30 correspond to the piezoelectric layers 12a and the electrodes 32 correspond to the electrodes 14.

It is preferred that the electrodes 32 be formed so as to define stripes on a mother board 30 under the following conditions (a), (b), and (c) when the piezoelectric resonator 10 is manufactured as described above.

(a) A plurality of electrodes 32 shall be formed as stripes on a mother board 30.

(b) An electrode interval "d," which is the sum of the width of an electrode 32 and the width of a portion where no electrode is formed between adjacent electrodes 32 on a mother board, shall be preferably constant and the width of each electrode 32 shall be also constant.

(c) The width "c" of a portion where the laminated member is cut by a dicing machine to make a piezoelectric resonator shall be a multiple of the electrode interval "d."

When a piezoelectric resonator is made with the foregoing conditions being satisfied, even if cut positions vary, the total area of the electrodes formed on a piezoelectric layer does not change and variations in characteristics are unlikely to occur. For example, when the electrode interval "d" is set to approximately 0.4 mm, the width "c" of a portion where the laminated member is cut by a dicing machine is set to approximately 0.4 mm, and the width of an electrode is set to approximately 0.2 mm, the foregoing conditions are satisfied and the total area of the electrodes formed on one piezoelectric layer is constant even if cut positions vary. Therefore, the resonator characteristics of a piezoelectric resonator to be made do not vary either.

Figure 5:
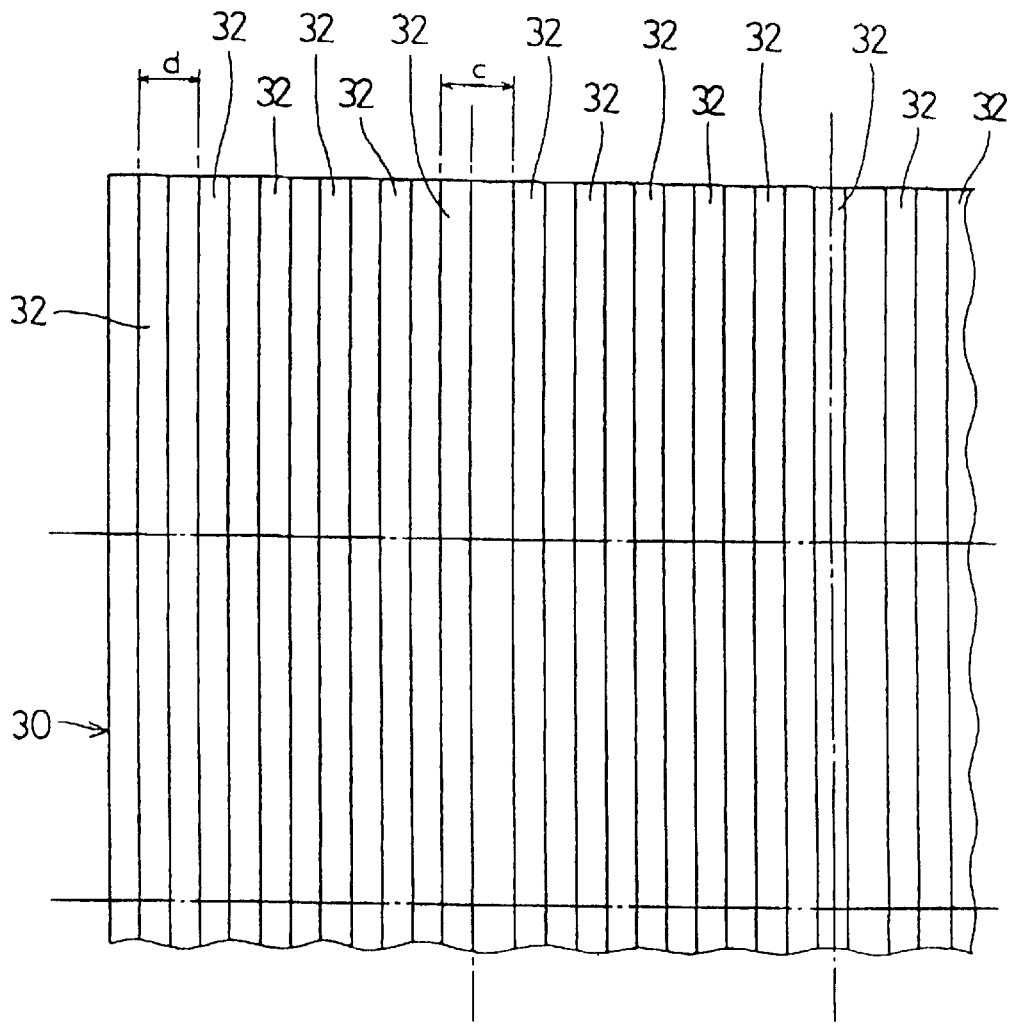
FIG. 5 is a view showing another mother board and other electrodes comprising stripes.

In contrast, if the foregoing conditions are not satisfied, when the width "c" of a portion where the laminated member is cut is not a multiple of the electrode interval "d" as shown in FIG. 5, for example, the total area of the electrodes formed on one piezoelectric layer differs depending on cut positions, and variations in resonator characteristics may occur.

The piezoelectric resonator 10 uses the external electrodes 20 and 22 as input and output electrodes. Piezoelectric layers 12a excluding the piezoelectric layers 12a disposed at both ends of the base member 12 are preferably piezoelectrically active because an electric field is applied between adjacent layers of the electrodes 14 by applying a signal to the external electrodes 20 and 22. Since voltages are applied in opposite directions to the piezoelectric layers 12a polarized in opposite directions in the base member 12, the piezoelectric layers 12a expand and contract as an integral unit in the same direction. In other words, an AC electric field in the longitudinal direction of the base member 12 is applied to each piezoelectric layer 12a by use of the electrodes 14 connected to the external electrodes 20 and 22, and a driving force for expansion and contraction is generated in each piezoelectric layer. Therefore, the entire piezoelectric resonator 10 as a whole vibrates in the longitudinal direction in a basic mode with the center of the base member 12 serving as a node.

In the piezoelectric resonator 10, the polarization direction of the piezoelectric layer 12a, the applied electric field direction resulting from an input signal, and the direction of vibration in the piezoelectric layer 12a are all the same. In other words, the piezoelectric resonator 10 is of stiffened type resonator. The piezoelectric resonator 10 has a larger electromagnetic coupling coefficient than an unstiffened piezoelectric resonator, in which the direction of vibration differs from the direction of polarization and electric field. Therefore, the piezoelectric resonator 10 has a larger frequency difference ΔF between the resonant frequency and the antiresonant frequency than the conventional unstiffened piezoelectric resonator. As a result, the piezoelectric resonator 10 achieves wide-frequency-band characteristics as compared with the conventional unstiffened piezoelectric resonator.

Figure 6:
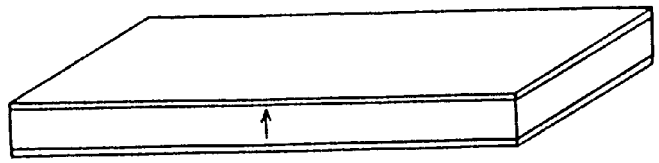
FIG. 6 is a perspective view of an unstiffened piezoelectric resonator which vibrates in the longitudinal direction, shown for comparison.
Figure 7:
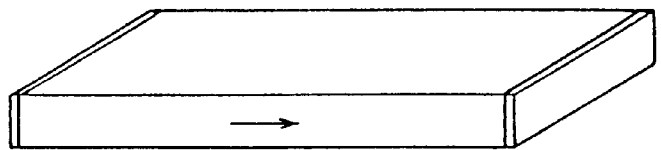
FIG. 7 is a perspective view of a stiffened piezoelectric resonator which vibrates in the longitudinal direction.
Figure 8:
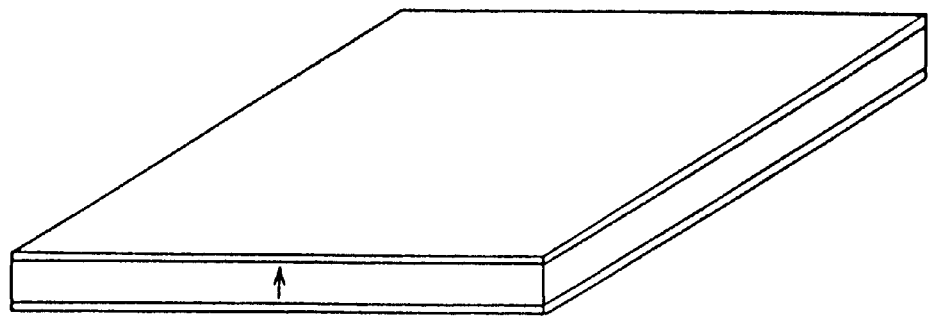
FIG. 8 is a perspective view of an unstiffened piezoelectric resonator which vibrates in the plane direction (square-type vibration), shown for comparison.

To measure differences between stiffened and unstiffened piezoelectric resonators, piezoelectric resonators shown in FIGS. 6, 7, and 8 were made. The piezoelectric resonator shown in FIG. 6 was made by disposing electrodes on both surfaces in the thickness direction of a piezoelectric substrate measuring approximately 4.0 mm by 1.0 mm by 0.38 mm. This piezoelectric resonator was polarized in the thickness direction and vibrated in the longitudinal direction when a signal was applied to the electrodes. The piezoelectric resonator shown in FIG. 7 has the same dimensions as the piezoelectric resonator shown in FIG. 6. Electrodes were disposed on both surfaces in the longitudinal direction of a piezoelectric substrate. The piezoelectric resonator was polarized in the longitudinal direction and vibrated in the longitudinal direction when a signal was applied to the electrodes. The piezoelectric resonator shown in FIG. 8 was made by forming electrodes on both surfaces in the thickness direction of a piezoelectric substrate measuring approximately 4.7 mm by 4.7 mm by 0.38 mm. This piezoelectric resonator was polarized in the thickness direction and vibrated in the plane direction when a signal was applied to the electrodes. The piezoelectric resonators shown in FIGS. 6 and 8 were unstiffened type resonators and the piezoelectric resonator shown in FIG. 7 was a stiffened type resonator.

The resonant frequency Fr and the electromechanical coupling coefficient K of each of these piezoelectric resonators were measured and the results are shown in Tables 1, 2, and 3. Table 1 indicates the measured results of the piezoelectric resonator shown in FIG. 6. Table 2 indicates the measured results of the piezoelectric resonator shown in FIG. 7. Table 3 indicates the measured results of the piezoelectric resonator shown in FIG. 8.

TABLE 1

|  | Basic longitudinal vibration | longitudinal triple-wave vibration | Width-mode vibration |
|---|---|---|---|
| Resonant frequency (MHZ) | 0.460 | 1.32 | 1.95 |
| Electro-mechanical coupling coefficient (%) | 18.9 | 3.9 | 25.2 |

TABLE 2

|  | Basic longitudinal vibration | longitudinal triple-wave vibration | Width-mode vibration |
|---|---|---|---|
| Resonant frequency (MHZ) | 0.455 | 1.44 | 1.96 |
| Electro-mechanical coupling coefficient (%) | 42.9 | 12.2 | 4.0 |

TABLE 3

|  | Basic longitudinal vibration | Square-type triple-wave vibration | Thickness mode vibration |
|---|---|---|---|
| Resonant frequency (MHZ) | 0.458 | 1.25 | 5.65 |
| Electro-mechanical coupling coefficient (%) | 35.0 | 11.5 | 23.3 |

It is understood from the measurement data that a stiffened piezoelectric resonator has a larger electromagnetic coupling coefficient K than an unstiffened piezoelectric resonator, and therefore has a larger frequency difference ΔF between the resonant frequency and the antiresonant frequency. The largest spurious vibration in a stiffened piezoelectric resonator is of longitudinal triple-wave type and the electromagnetic coupling coefficient K is 12.2% during vibration. During width-mode vibration, which is different from basic vibration, the electromagnetic coupling coefficient K is 4.0%. In contrast, the electromagnetic coupling coefficient K during width-mode vibration is 25.2% in an unstiffened longitudinal-vibration piezoelectric resonator. In an unstiffened square-type vibration piezoelectric resonator, the electromagnetic coupling coefficient K is as large as 23.3% during thickness-mode vibration. Therefore, it is understood that a stiffened piezoelectric resonator has smaller spurious vibrations than an unstiffened piezoelectric resonator.

In the piezoelectric resonator 10, at least some of a plurality of electrodes 14 are only partially formed on surfaces of the piezoelectric layers 12a which are substantially perpendicular to the longitudinal direction of the base member 12, the overlapping or common area of the opposing portions of adjacent electrodes as seen from the direction perpendicular to the electrodes can be changed and ΔF is thereby easily adjusted. This leads to a high degree of freedom and flexibility in resonator characteristics design.

In the piezoelectric resonator 10, the capacitance of the resonator can be easily adjusted by changing the overlapping or common areas of the opposing portions of adjacent electrodes 14, the number of the piezoelectric layers 12a, or the electrodes 14, or the dimensions of the piezoelectric layers 12a in the longitudinal direction of the base member 12. In other words, the capacitance can be increased by increasing the overlapping areas of the opposing portions of adjacent electrodes 14, the number of the piezoelectric layers 12a, or the electrodes 14, or by decreasing the dimensions of the piezoelectric layers 12a in the longitudinal direction of the base member 12. In contrast, the capacitance can be reduced by reducing the overlapping areas of the opposing portions of adjacent electrodes 14, the number of the piezoelectric layers 12a, or the electrodes 14, or by increasing the dimensions of the piezoelectric layers 12a in the longitudinal direction of the base member 12. Thus, a high degree of freedom and flexibility in capacitance design is achieved. Therefore, it is easy to achieve impedance matching with an external circuit when the piezoelectric resonator 10 is mounted on a circuit board and used.

Figure 9:
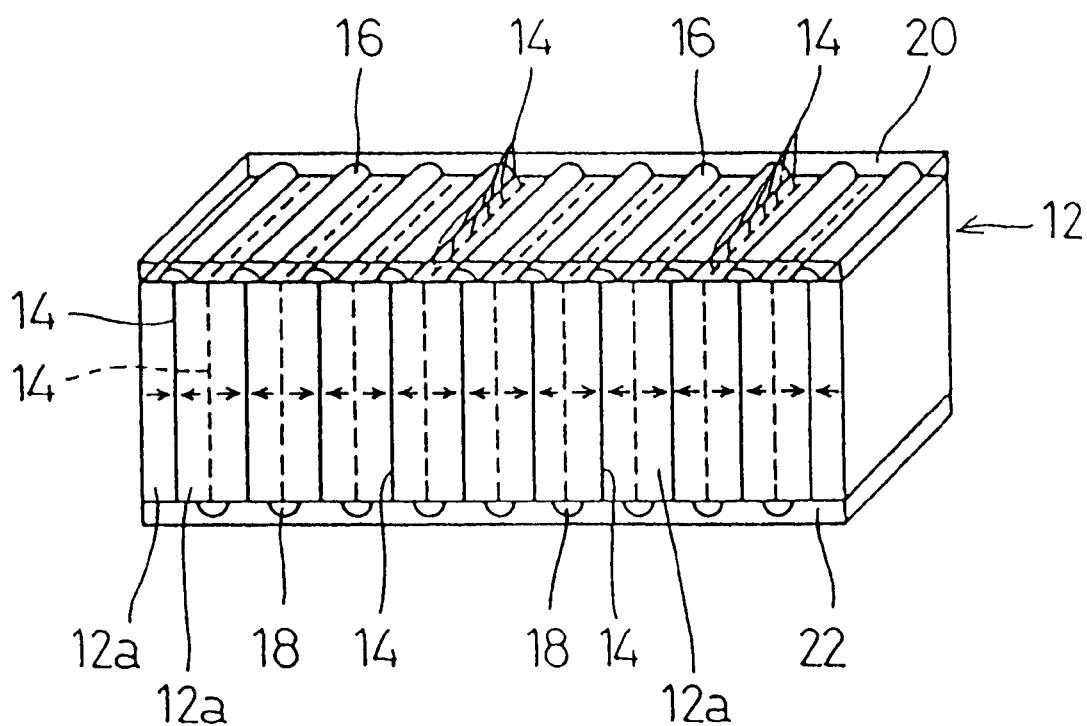
FIG. 9 is a view of another piezoelectric resonator according to the preferred embodiments of the present invention.
Figure 10:
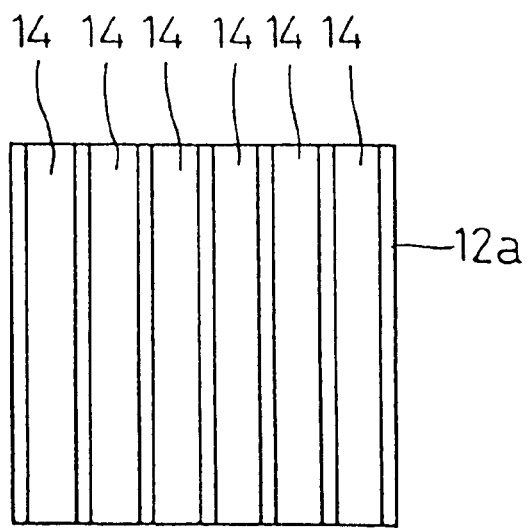
FIG. 10 is a plan showing electrodes used in the piezoelectric resonator shown in FIG. 9.
Figure 11:
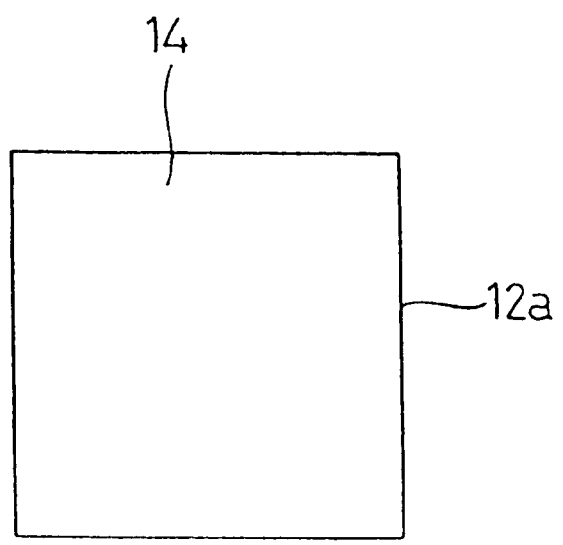
FIG. 11 is a plan showing another electrode used in the piezoelectric resonator shown in FIG. 9.

FIG. 9 is a view showing another piezoelectric resonator according to the preferred embodiments of the present invention. Unlike the piezoelectric resonator shown in FIGS. 1 and 2, in the piezoelectric resonator shown in FIG. 9, each of alternate layers of electrodes 14 is formed so as to cover an entire area of a main surface of the piezoelectric layers 12a which is substantially perpendicular to the longitudinal direction of the base member 12. In other words, in the piezoelectric resonator 10 shown in FIG. 9, each of alternate layers of electrodes 14 including the second electrode layer from one end of the base member in the longitudinal direction is formed as six stripes on a main surface of the piezoelectric layers 12a which is substantially perpendicular to the longitudinal direction of the base member 12 as shown in FIG. 10, and each of the other alternate layers of electrodes 14 including the first electrode layer from the end of the base member in the longitudinal direction is formed to cover an entire area of a main surface of the piezoelectric layers 12a which is substantially perpendicular to the longitudinal direction of the base member 12 as shown in FIG. 11.

The piezoelectric resonator shown in FIG. 9 achieves the same advantages as the piezoelectric resonator shown in FIGS. 1 and 2.

Since the piezoelectric resonator shown in FIG. 9 has a larger overlapping area of the opposing portions of each pair of adjacent electrode layers than the piezoelectric resonator shown in FIGS. 1 and 2, the piezoelectric resonator shown in FIG. 9 has a larger ΔF and capacitance.

Unlike the piezoelectric resonator shown in FIGS. 1 and 2, since each of alternate layers of electrodes 14 is formed to cover the entire area of a main surface of the piezoelectric layers 12a which is substantially perpendicular to the longitudinal direction of the base member 12 in the piezoelectric resonator shown in FIG. 9, when the piezoelectric layers 12a and stripe-shaped electrodes 14 are formed by cutting large piezoelectric layers of which, electrodes have been formed as multiple stripes on main surfaces, even if cut positions shift, the overlapping area of the opposing portions of each pair of adjacent electrodes 14 changes little and the resonator characteristics do not significantly vary.

Figure 12:
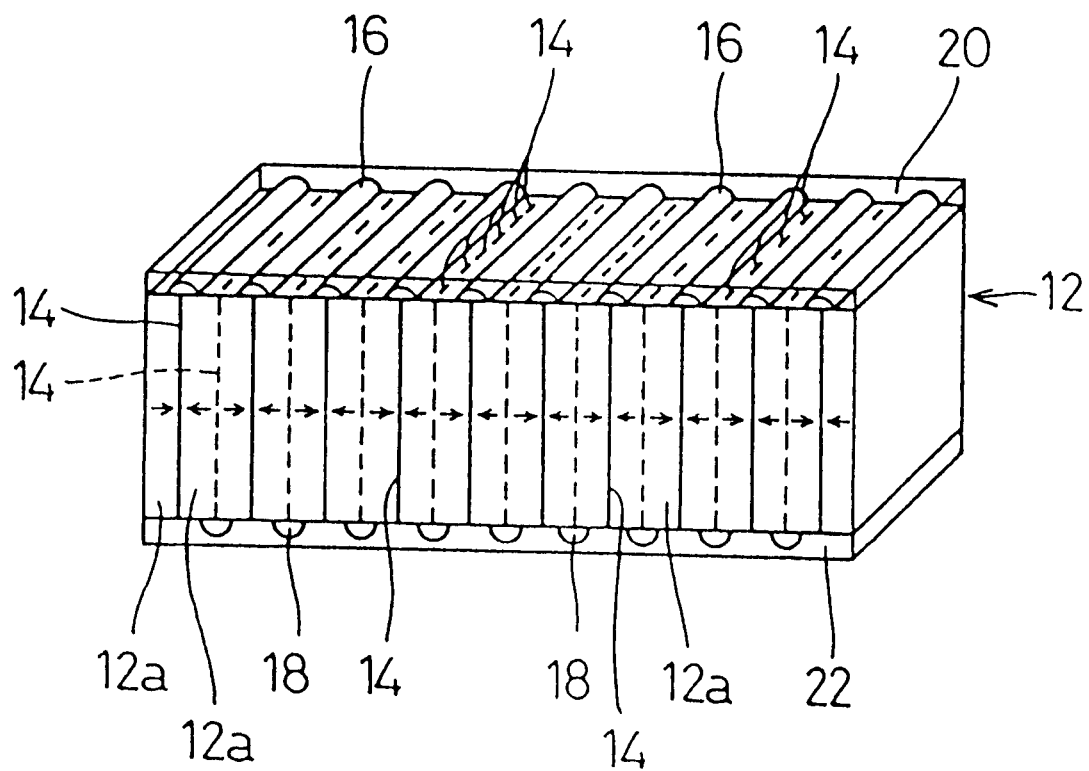
FIG. 12 is a view of still another piezoelectric resonator according to the preferred embodiments of the present invention.

FIG. 12 is a view showing still another piezoelectric resonator according to the preferred embodiments of the present invention. Unlike the piezoelectric resonator shown in FIG. 9, since the total area of electrodes 14 formed as stripes for one layer of electrodes is larger as the layer is disposed closer to the center of the base member 12 in the longitudinal direction of the piezoelectric resonator shown in FIG. 12, the overlapping area of the opposing portions of each pair of adjacent electrodes 14 increases as the pair of electrodes 14 is disposed closer to the center of the base member 12 in the longitudinal direction. The other configurations are the same as in the piezoelectric resonator shown in FIG. 9. Only the difference therebetween will be described below.

Figure 13:
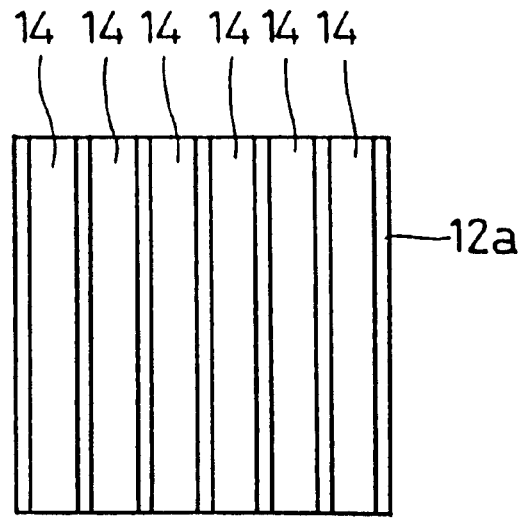
FIG. 13 is a plan showing electrodes used in the piezoelectric resonator shown in FIG. 12.
Figure 14:
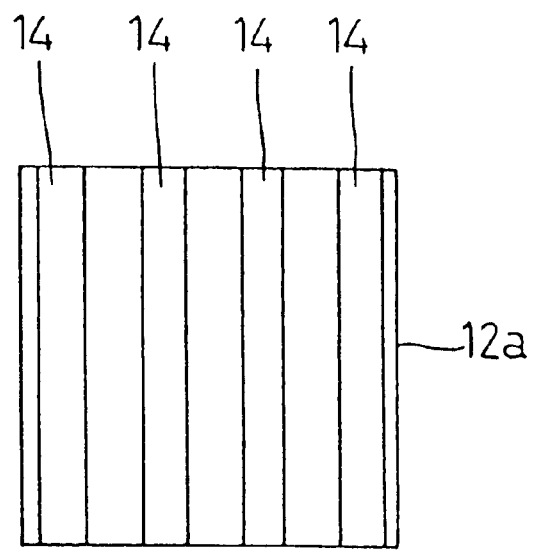
FIG. 14 is a plan showing other electrodes used in the piezoelectric resonator shown in FIG. 12.
Figure 15:
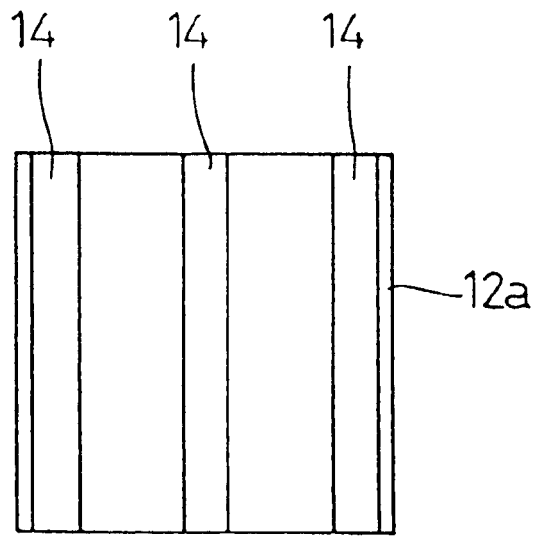
FIG. 15 is a plan showing still other electrodes used in the piezoelectric resonator shown in FIG. 12.
Figure 16:
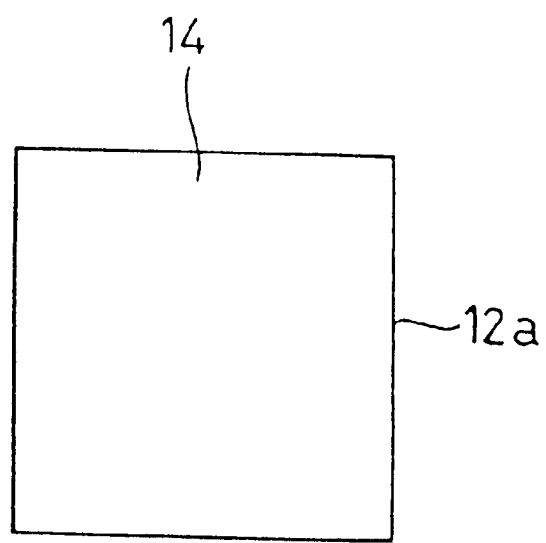
FIG. 16 is a plan showing a further electrode used in the piezoelectric resonator shown in FIG. 12.

In the piezoelectric resonator 10 shown in FIG. 12, each of alternate layers of electrodes 14 disposed at the center of the base member 12 in the longitudinal direction is preferably formed as six stripes on a main surface of the piezoelectric layers 12a which is substantially perpendicular to the longitudinal direction of the base member 12 as shown in FIG. 13. Each of alternate layers of electrodes 14 disposed outside of the alternate layers described above is preferably formed as four stripes on a main surface of the piezoelectric layers 12a which is substantially perpendicular to the longitudinal direction of the base member 12 as shown in FIG. 14. Each of alternate layers of electrodes 14 disposed further outside of the alternate layers described above is formed as three stripes on a main surface of the piezoelectric layers which is substantially perpendicular to the longitudinal direction of the base member 12 as shown in FIG. 15. In this case, these electrodes 14 are preferably formed, for example, in straight belt shapes between opposing sides of the piezoelectric layers 12a in the direction in which the external electrodes 20 and 22 are disposed opposite to each other. These electrodes 14 formed as stripes preferably have almost the same width. Each of the other layers of electrodes 14 is preferably formed to cover the entire area of a main surface of the piezoelectric layers 12a which is substantially perpendicular to the longitudinal direction of the base member 12 as shown in FIG. 16. Therefore, the overlapping area of the opposing portions of adjacent electrodes increases as the electrodes are disposed closer to the center of the base member 12 in the longitudinal direction.

The piezoelectric resonator shown in FIG. 12 achieves the same advantages as the piezoelectric resonator shown in FIG. 9.

Figure 17:
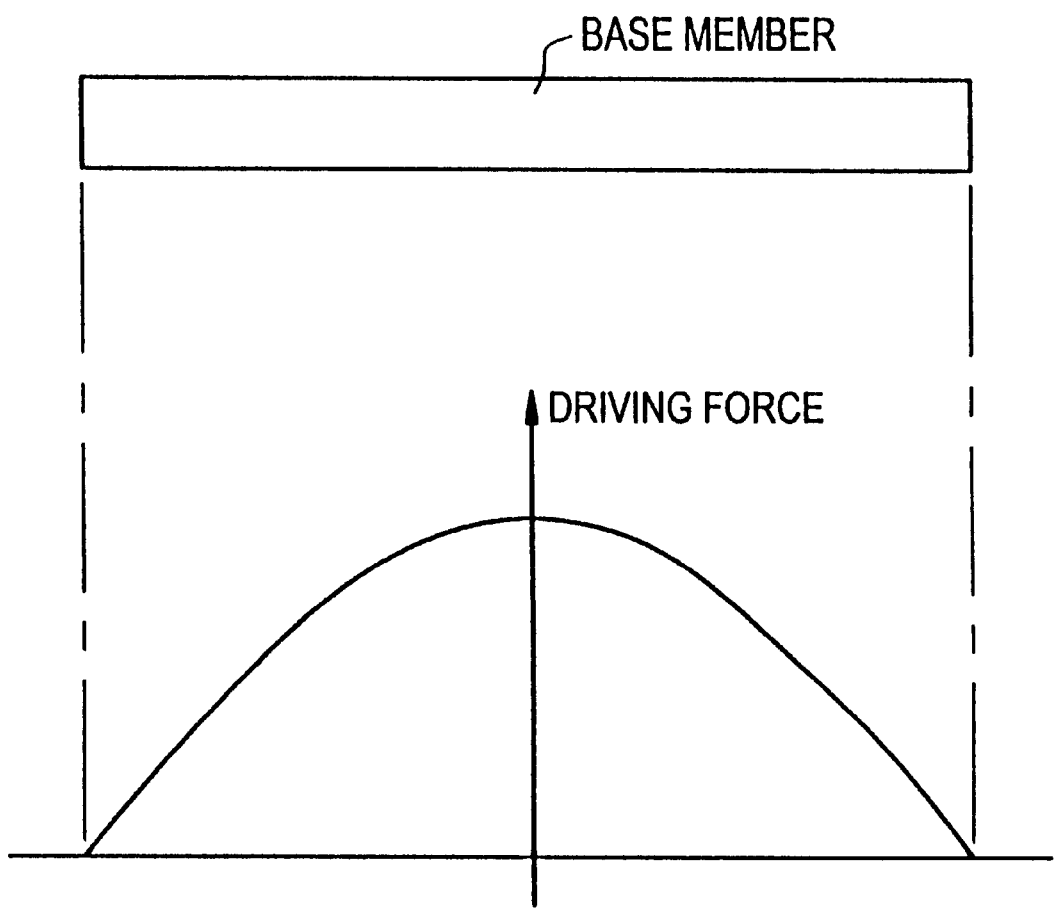
FIG. 17 is a view indicating ideal driving force required for the base member during longitudinal basic vibration.

In longitudinal basic vibration, a stronger driving force is required at a portion located closer to the center of the base member in the longitudinal direction because of the large mass extending from this portion to an end of the base member in the longitudinal direction. Ideally, as shown in FIG. 17, a driving force which is different in strength and corresponds to a cosine curve having the length of the base member as half the wavelength and a maximum amplitude at the center in the longitudinal direction of the base member is required. In contrast, in the piezoelectric resonator 10 shown in FIG. 12, since a plurality of electrodes 14 are formed such that the overlapping area of the opposing portions of adjacent electrodes 14 increases as the electrodes are disposed closer to the center of the base member 12 in the longitudinal direction, a driving force which is different in strength and is well suited to longitudinal basic vibration, is obtained in the whole zone in the longitudinal direction of the base member 12. Therefore, the electromagnetic coupling coefficient and ΔF are substantially increased.

In the piezoelectric resonator shown in FIG. 12, since the capacitance between electrodes 14 increases as the electrodes are disposed closer to the center of the base member in the longitudinal direction as compared with a piezoelectric resonator having a lamination structure in which the overlapping area of the opposing portions of adjacent electrodes is constant, such as the piezoelectric resonator shown in FIG. 9, charges generated in each piezoelectric layer 12a by odd-number-high-order-mode vibrations, such as the third-order and fifth-order vibrations, are canceled, and high-order-mode spurious vibrations are suppressed.

Figure 18:
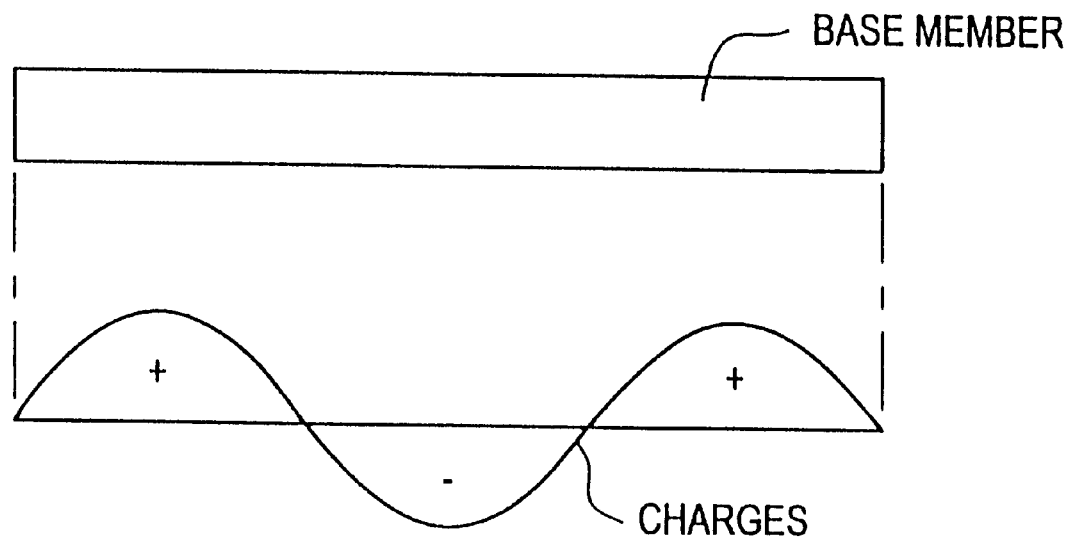
FIG. 18 is a view indicating charges generated by the third-order spurious vibration in the base member of the piezoelectric resonator shown in FIG. 9.
Figure 19:
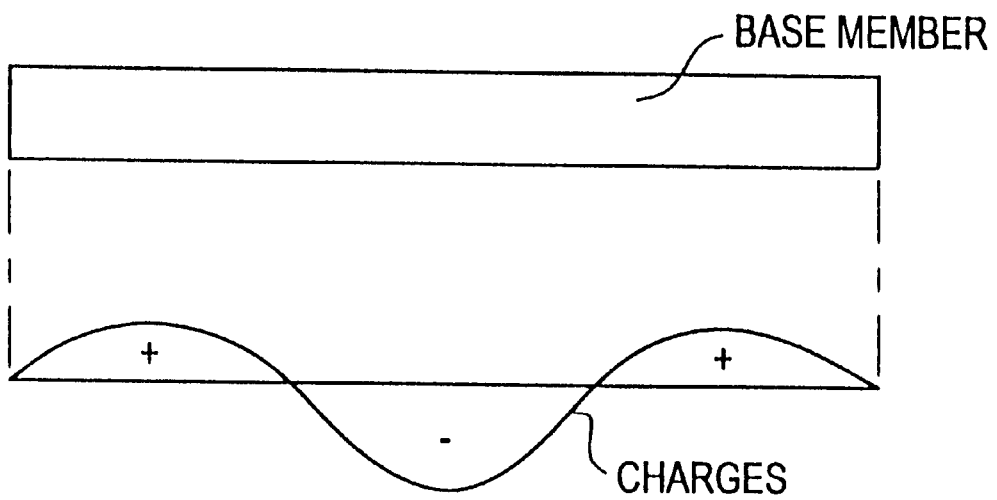
FIG. 19 is a view showing charges generated by the third-order spurious vibration in the base member of the piezoelectric resonator shown in FIG. 12.
Figure 20:
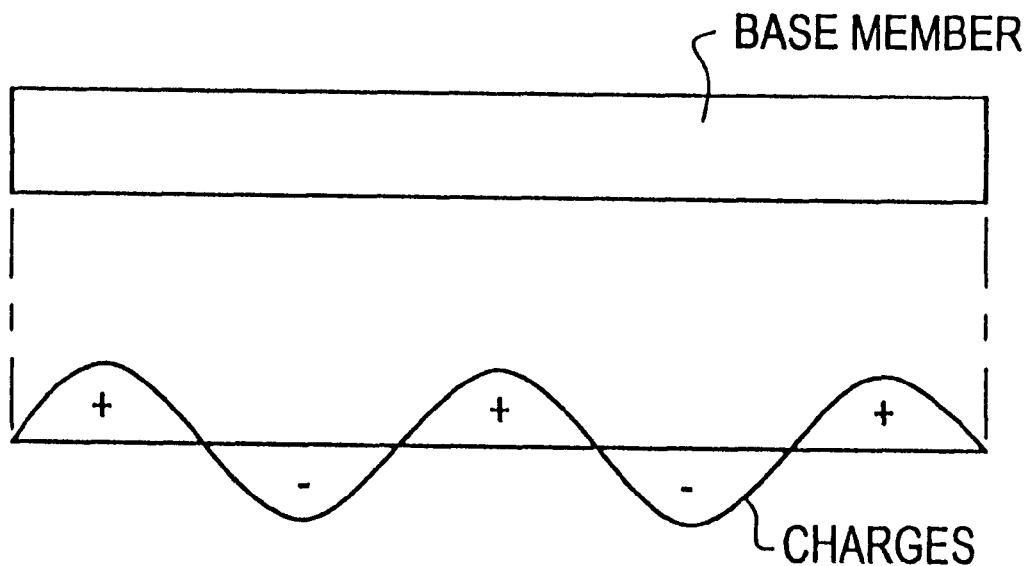
FIG. 20 is a view indicating charges generated by the fifth-order spurious vibration in the base member of the piezoelectric resonator shown in FIG. 9.
Figure 21:
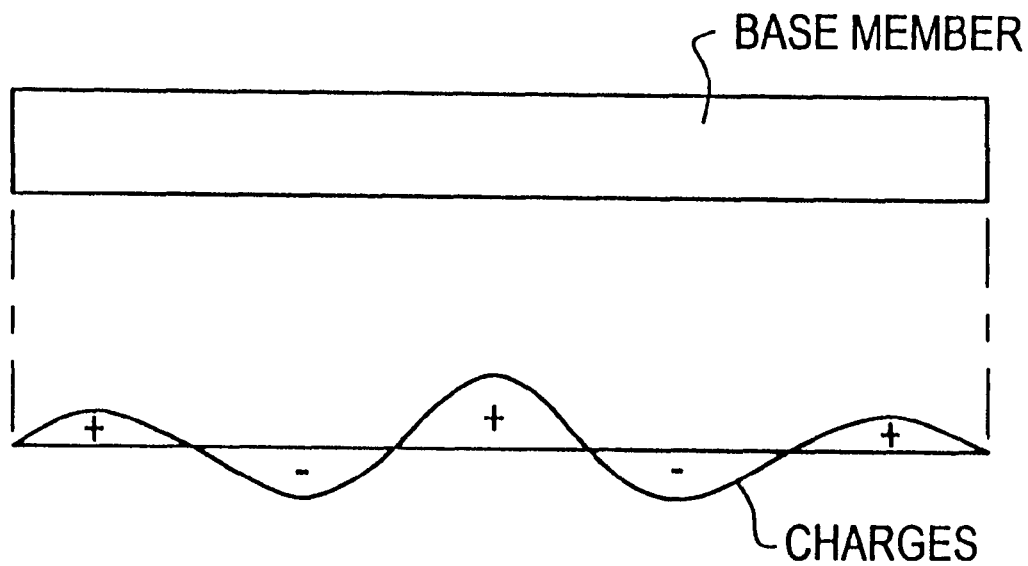
FIG. 21 is a view showing charges generated by the fifth-order spurious vibration in the base member of the piezoelectric resonator shown in FIG. 12.

The third-order-mode spurious vibration is considered, for example. As shown in FIG. 18, charges having a cyclic amplitude and the same maximum amplitude are generated from one end to the other end in the longitudinal direction of the base member in the piezoelectric resonator shown in FIG. 9 and the charges are not sufficiently canceled and thus, remain. In contrast, in the piezoelectric resonator shown in FIG. 12, charges are generated such that they have a larger amplitude as they are generated closer to the center of the base member in the longitudinal direction as shown in FIG. 19, and most of the charges are canceled. Next, the fifth-order-mode spurious vibration is examined. In the same way as in the third-order-mode spurious vibration, charges having a cyclic amplitude and the same maximum amplitude are generated as shown in FIG. 20 from one end to the other end in the longitudinal direction of the base member in the piezoelectric resonator shown in FIG. 9 and the charges are not sufficiently canceled and thus, remain. In contrast, in the piezoelectric resonator shown in FIG. 12, charges are generated such that they have a larger amplitude as they are generated closer to the center of the base member in the longitudinal direction as shown in FIG. 21, and most of the charges are canceled. In odd-number-order-mode spurious vibrations, such as the seventh-, ninth-, and eleventh-order vibrations, most charges are canceled as in the third- and fifth-order-mode spurious vibration. Therefore, the piezoelectric resonator shown in FIG. 12 suppresses high-order-mode spurious vibrations more than the piezoelectric resonator shown in FIG. 9.

Figure 22:
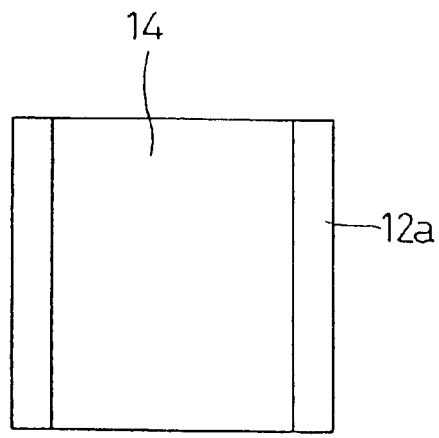
FIG. 22 is a plan showing another electrode used in a piezoelectric resonator according to the preferred embodiment of the present invention.
Figure 23:
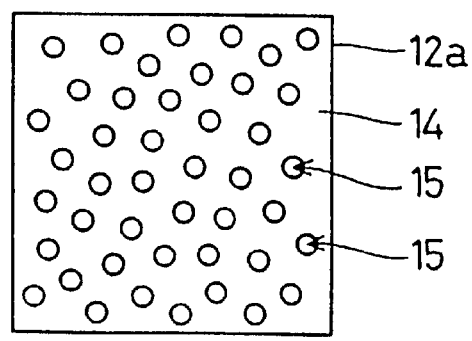
FIG. 23 is a plan showing still another electrode used in a piezoelectric resonator according to the preferred embodiments of the present invention.

In the piezoelectric resonators described above, electrodes 14 are preferably formed as multiple stripes on a main surface of the piezoelectric layers 12a which layers are substantially perpendicular to the longitudinal direction of the base member 12 and electrodes 14 preferably are formed to cover the entire area of a main surface of the piezoelectric layers 12a which layers are substantially perpendicular to the longitudinal direction of the base member 12. According to the preferred embodiments of the present invention, electrodes 14 may be formed as a single stripe on a main surface of a piezoelectric layer 12a which is substantially perpendicular to the longitudinal direction of the base member 12 as shown in FIG. 22, or formed with holes 15 as shown in FIG. 23.

Figure 23A:
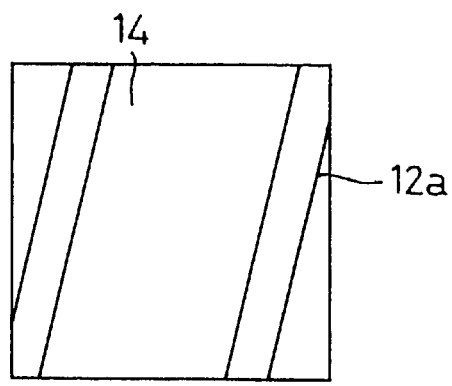
FIG. 23A is a plan view showing another electrode used in a piezoelectric resonator according to the preferred embodiments of the present invention.

Electrodes 14 may be formed as one or more stripes as seen in FIG. 23A and disposed at an angle on the side surface on which an external electrode is provided, on a main surface of a piezoelectric layer which is substantially perpendicular to the longitudinal direction of the base member 12.

Figure 24:
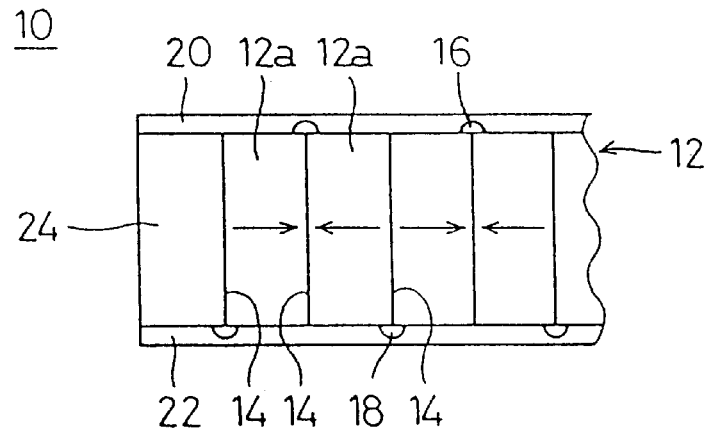
FIG. 24 is a view of an inactive section.
Figure 25:
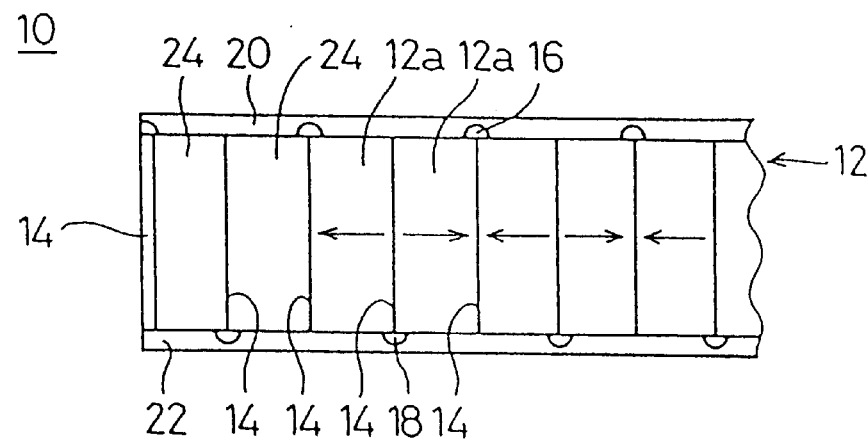
FIG. 25 is a view of another inactive section.
Figure 26:
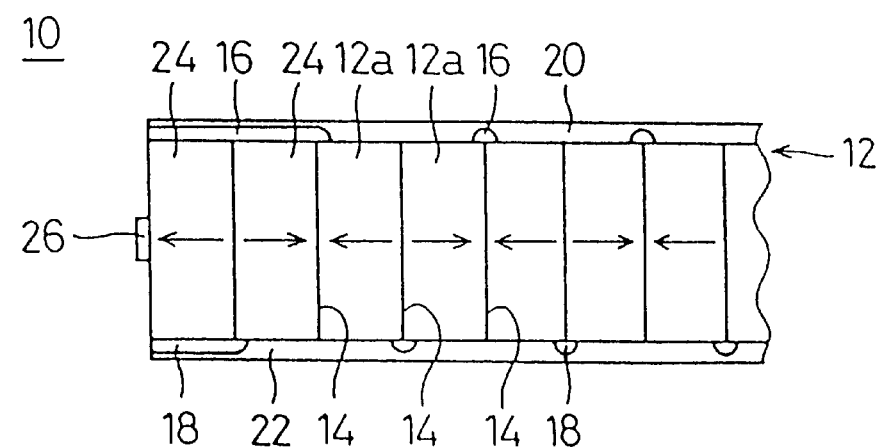
FIG. 26 is a view of still another inactive section.

In the above-described piezoelectric resonator 10, the base member 12 is preferably formed such that the piezoelectric layers 12a disposed at both ends of the base member 12 in the longitudinal direction serve as piezoelectrically inactive sections and the other piezoelectric layers 12a serve as piezoelectrically active sections. Such inactive sections 24 may be formed such that an electric field is not applied by not providing electrodes 14 at the ends of the base member 12 as shown in FIG. 24. The ends of the base member 12 may be polarized or may not be polarized. As shown in FIG. 25, only the ends of the base member 12 may be not polarized. In this case, even if an electric field is applied between the electrodes 14, the portions not polarized are piezoelectrically inactive. The structure may be formed such that an electric field is not applied to the piezoelectric layers serving as the inactive sections 24 because the sections are insulated by the insulating films 16 and 18 even if the sections are polarized, as shown in FIG. 26. In other words, only when a piezoelectric layer is polarized and an electric field is applied, does the layer becomes piezoelectrically active, otherwise it is inactive. In the configuration shown in FIG. 25, a capacitor is preferably provided in an inactive section, and the capacitance of the piezoelectric resonator is substantially increased. A small electrode 26 may be also provided on an end surface of the base member 12 in the longitudinal direction as shown in FIG. 26 in order to adjust the frequency or to connect to an external circuit.

A piezoelectric resonator according to preferred embodiments of the present invention may not necessarily include an inactive section. The base member may include active sections only.

In each of the above-described piezoelectric resonators 10, one piezoelectric layer 12a is provided between two adjacent layers of electrodes 14. A plurality of piezoelectric layers may be provided therebetween.

A dummy electrode which is not connected to an external electrode may be provided on the base member 12.

Figure 27:
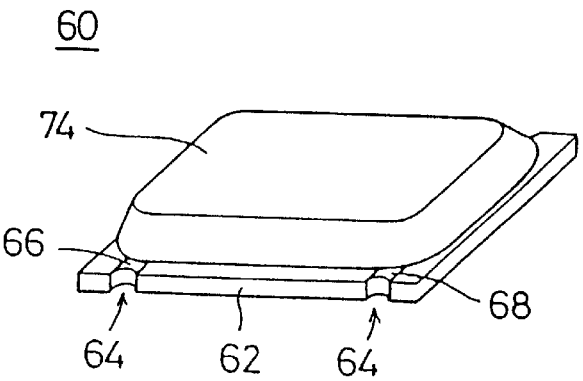
FIG. 27 is a perspective view of an electronic component using a piezoelectric resonator according to the preferred embodiments of the present invention.
Figure 28:
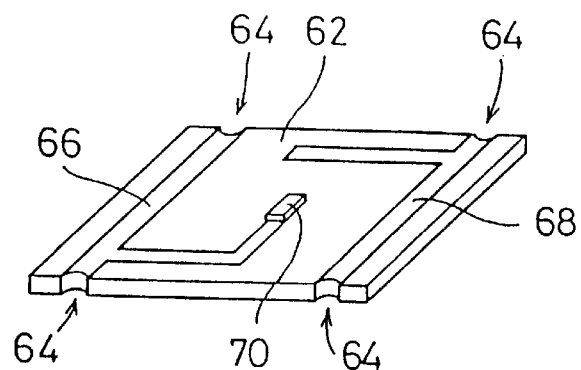
FIG. 28 is a perspective view of an insulating substrate used in the electronic component shown in FIG. 27.

Using such a piezoelectric resonator 10, electronic components such as oscillators and discriminators are produced. FIG. 27 is a perspective view of an electronic component 60 according to another preferred embodiment. The electronic component 60 includes an insulating substrate 62 serving as a support member. At opposing end portions of the insulating substrate 62, two indentations 64 are formed, respectively. On one surface of the insulating substrate 62, two pattern electrodes 66 and 68 are provided as shown in FIG. 28. One pattern electrode 66 is arranged between opposing indentations 64 and extends in an L-shaped manner from a point near one end toward the center of the insulating substrate 62. The other pattern electrode 68 is arranged between opposing indentations 64 and extends straight from a point near the other end toward the center of the insulating substrate 62. The pattern electrodes 66 and 68 are arranged such that they are routed in a roundabout fashion from the ends of the insulating substrate 62 to the opposite surface.

Figure 29:
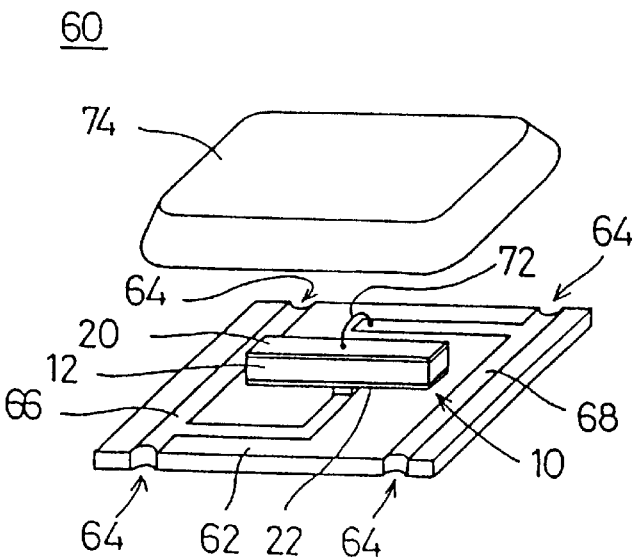
FIG. 29 is an exploded perspective view of the electronic component shown in FIG. 27.

At one end of the pattern electrode 66 preferably disposed at the center of the insulating substrate 62, a protrusion 70 serving as a mounting member is formed with electrically conductive adhesive. As shown in FIG. 29, the above-described piezoelectric resonator 10 is mounted on the protrusion 70 such that the center of the base member 12 is preferably on the protrusion 70. An external electrode 22 of the piezoelectric resonator 10 is, for example, connected to the protrusion 70. The protrusion 70 may be formed on the piezoelectric resonator 10 in advance. The other external electrode 20 is connected to a pattern electrode 68 with electrically conductive wire 72. The electrically conductive wire 72 is connected to the center of the external electrode 20 of the piezoelectric resonator 10.

A metal cap 74 is placed on the insulating substrate 62 to complete the electronic component 60. To prevent the metal cap 74 from being short-circuited to the pattern electrodes 66 and 68, insulating resin is preferably applied to the insulating substrate 62 and the pattern electrodes 66 and 68 in advance. The electronic component 60 uses the pattern electrodes 66 and 68, which are formed such that they are routed to the rear surface from ends of the insulating substrate 62, as input and output terminals for connecting to external circuits.

Since the center of the piezoelectric resonator 10 is secured to the protrusion 70 in this electronic component 60, the ends of the piezoelectric resonator 10 are disposed separately from the insulating substrate 62 so vibration is not prevented or damped. The longitudinal vibration generated in the resonator 10 is not weakened because the center of the piezoelectric resonator, which serves as a node, is secured to the protrusion 70 and is connected to the electrically conductive wire 72.

The electronic component 60 is preferably mounted on a circuit board together with IC chips and other components to form an oscillator or a discriminator. Since the electronic component 60 is sealed and protected by the metal cap 74, it can be used as a chip-type, surface-mountable component which can be mounted by reflow soldering or other suitable method.

When the electronic component 60 is used in an oscillator, spurious vibrations are suppressed to a low level and unusual vibration caused by the spurious vibrations is prevented as a result of the unique structure of the piezoelectric resonator 10 provided in the electronic component 60. It is also easy to achieve impedance matching with an external circuit since the capacitance of the piezoelectric resonator 10 is set to any desired value. Especially when the electronic component is used for an oscillator for voltage-controlled oscillation, a wide frequency range which is achieved conventionally is achieved due to a large ΔF of the resonator.

When the electronic component 60 is used for a discriminator, a wide peak-separation range is provided due to a large ΔF of the resonator. In addition, since the resonator provides a wide capacitance range, it is easy to achieve impedance matching with an external circuit.

Figure 30:
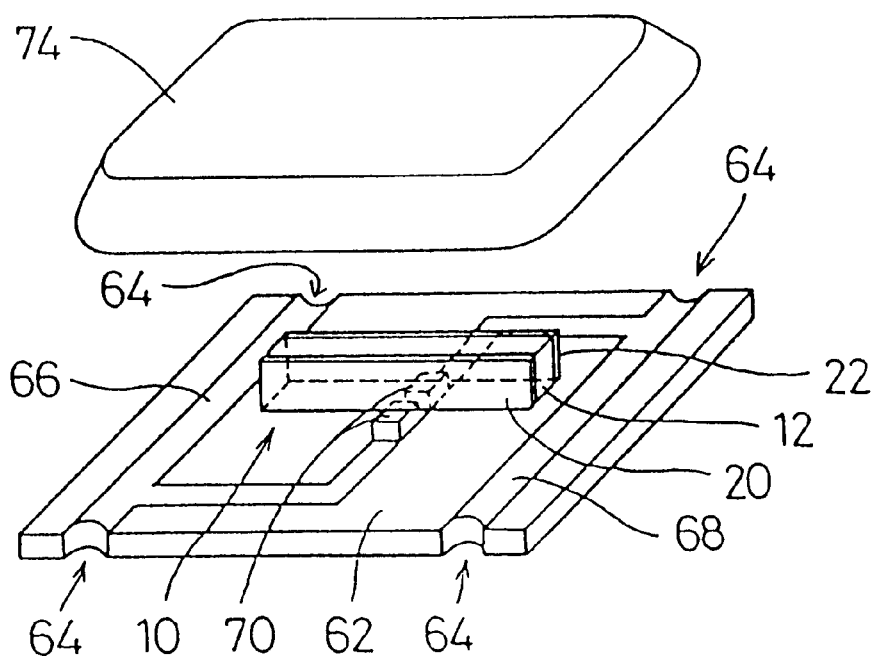
FIG. 30 is a view indicating another structure for mounting the piezoelectric resonator on the insulating substrate.
Figure 31:
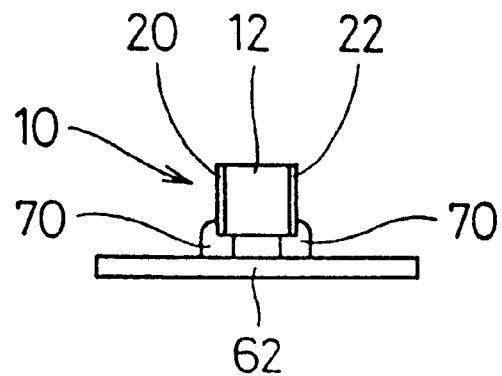
FIG. 31 is a side view showing the structure for mounting the piezoelectric resonator, shown in FIG. 30.
Figure 32:
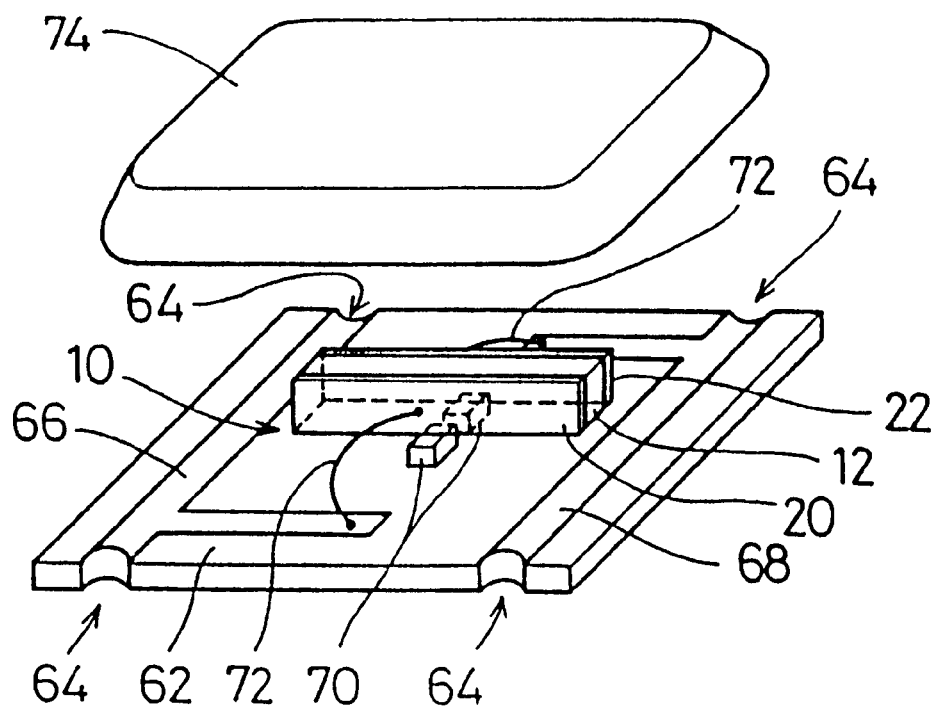
FIG. 32 is a view indicating still another structure for mounting the piezoelectric resonator on the insulating substrate.
Figure 33:
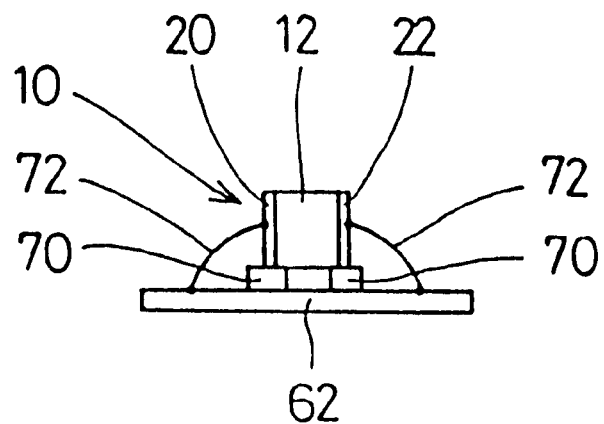
FIG. 33 is a side view showing the structure for mounting the piezoelectric resonator, shown in FIG. 32.

The piezoelectric resonator 10 may be mounted on the insulating substrate 62 so that two protrusions 70 made from an electrically conductive material such as electrically conductive adhesive are disposed on both pattern electrodes 66 and 68, and the external electrodes 20 and 22 of the piezoelectric resonator 10 are connected to the two protrusions 70, as shown in FIGS. 30 and 31. The piezoelectric resonator 10 may also be mounted on the insulating substrate 62 in a way shown in FIGS. 32 and 33 in which two protrusions 70 made from an insulating material such as insulating adhesive are disposed on the insulating substrate 62 and the external electrodes 20 and 22 are connected to the pattern electrodes 66 and 68 with electrically conductive wire 72. The protrusions 70 may be disposed on the piezoelectric resonator 10 in advance.

Figure 34:
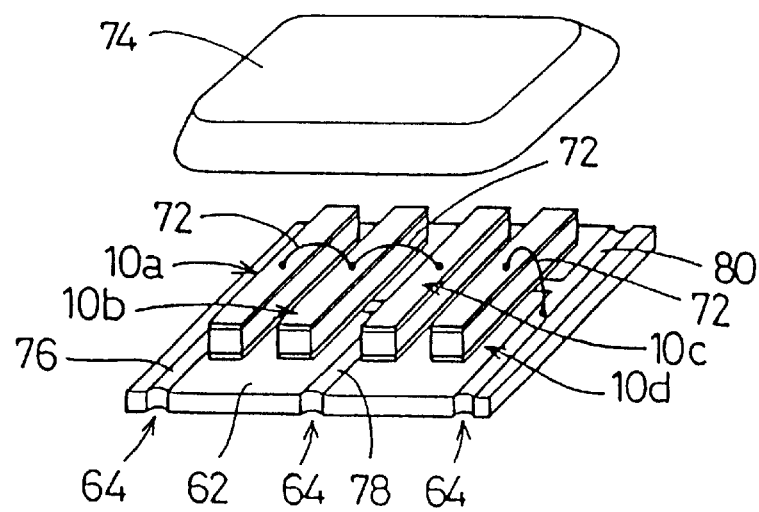
FIG. 34 is an exploded perspective view of a ladder filter using piezoelectric resonators according to the preferred embodiments of the present invention.
Figure 35:
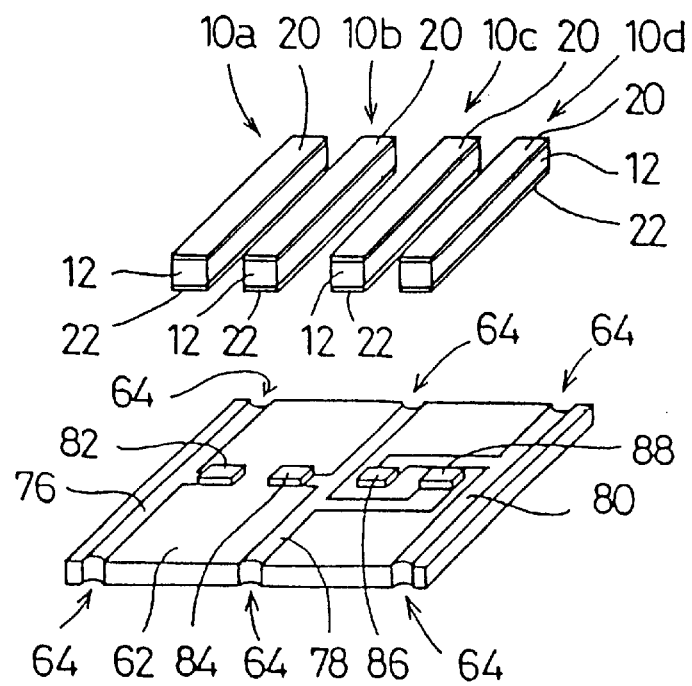
FIG. 35 is an exploded perspective view of an insulating substrate and the piezoelectric resonators used in the ladder filter shown in FIG. 34.

A ladder filter can be made using a plurality of the novel piezoelectric resonators 10. As shown in FIGS. 34 and 35, three pattern electrodes 76, 78, and 80 are disposed on an insulating substrate 62 serving as a support member in an electronic component 60. Protrusions 82 and 86 serving as mounting members are formed with electrically conductive adhesive on both-end pattern electrodes 76 and 80. On the center pattern electrode 78, two protrusions 84 and 88 serving as mounting members are formed with electrically conductive adhesive.

One external electrode 22 for each of piezoelectric resonators 10a, 10b, 10c, and 10d is mounted to each of the protrusions 82, 84, 86, and 88, respectively. The protrusions 82, 84, 86, and 88 may be formed on the piezoelectric resonators 10a, 10b, 10c, and 10d in advance. The other external electrodes 20 for piezoelectric resonators 10a, 10b, and 10c are connected to each other with electrically conductive wire 72. The other external electrode 20 of a piezoelectric resonator 10d is connected to the pattern electrode 80 with electrically conductive wire 72. A metal cap 74 is placed on the insulating substrate 62.

Figure 36:
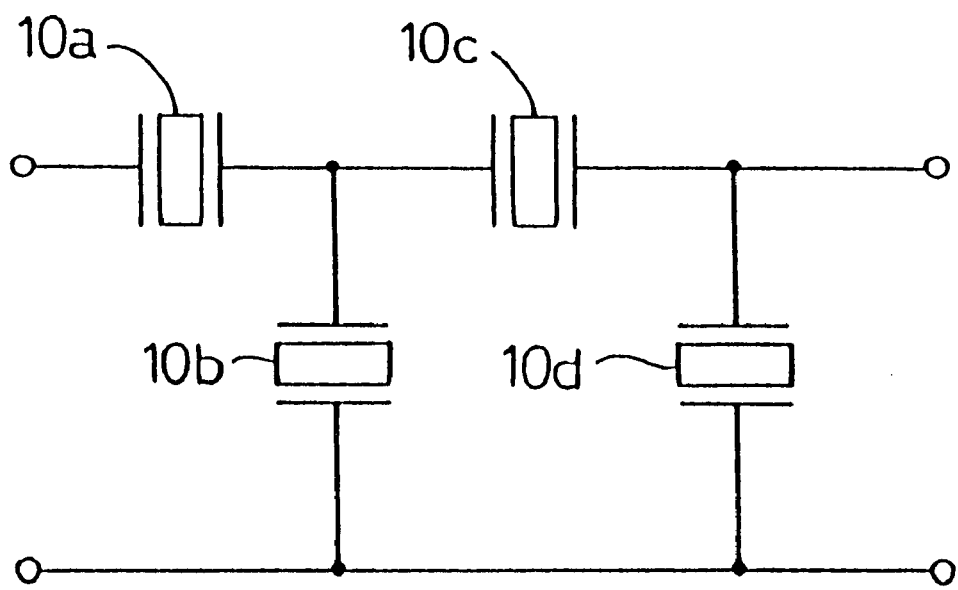
FIG. 36 is an equivalent circuit diagram of the ladder filter shown in FIGS. 34 and 35.

The electronic component 60 is used as a ladder filter having a ladder-shaped circuit shown in FIG. 36. Two piezoelectric resonators 10a and 10c serve as series resonators and the other two piezoelectric resonator 10c and 10d serve as parallel resonators. In such a ladder filter, the parallel piezoelectric resonators 10b and 10d are designed to have substantially larger capacitances than the series piezoelectric resonators 10a and 10c.

Attenuation in the ladder filter is determined by the capacitance ratio between the series resonators and the parallel resonators. In this electronic component 60, the capacitance can be adjusted by changing the number of laminated layers used in the piezoelectric resonators 10a to 10d. Therefore, a ladder filter having a larger attenuation with fewer resonators is achieved by changing the capacitances of the piezoelectric resonators, as compared with a case where the conventional unstiffened piezoelectric resonators are used. Since the piezoelectric resonators 10a to 10d have a larger ΔF than the conventional piezoelectric resonator, a wider transmission frequency band is achieved as compared with the conventional piezoelectric resonator.

Figure 37:
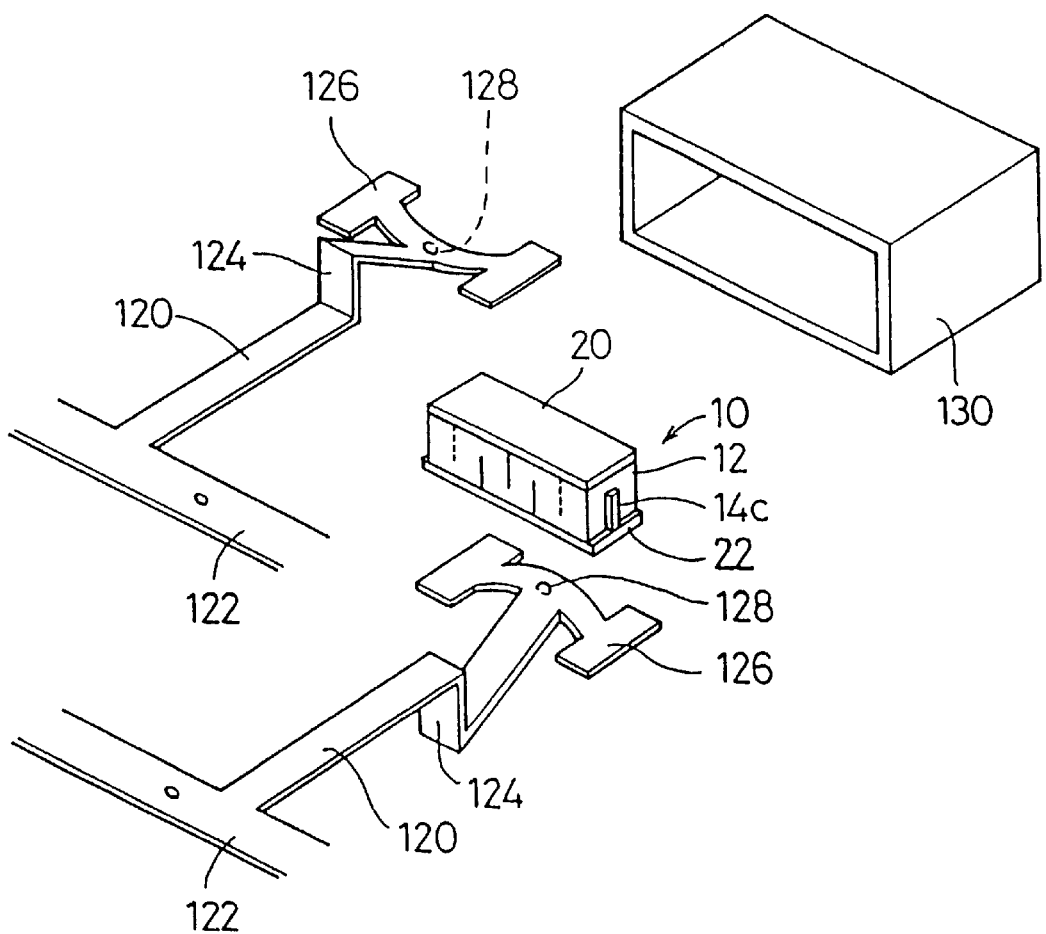
FIG. 37 is an exploded perspective view of a two-terminal electronic component using a piezoelectric resonator according to the preferred embodiments of the present invention.
Figure 38:
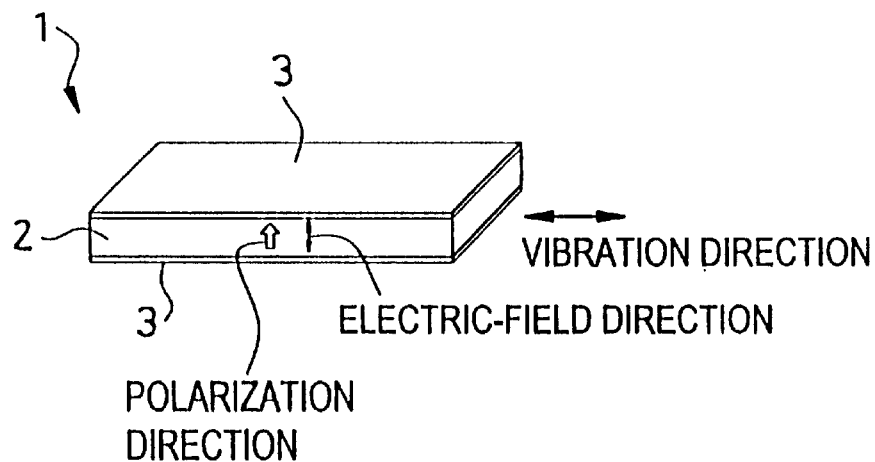
FIG. 38 is a perspective view of a conventional piezoelectric resonator.
Figure 39:
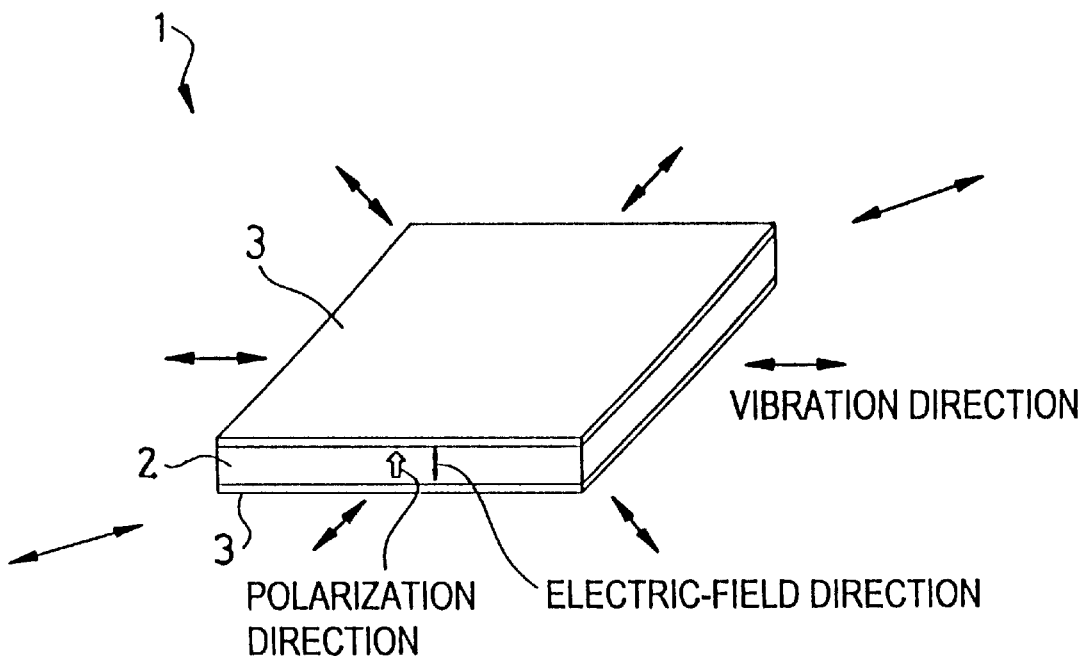
FIG. 39 is a perspective view of another conventional piezoelectric resonator.

A two-terminal electronic component 60 such as a ceramic oscillator and a ceramic discriminator can be produced with a piezoelectric resonator 10 as shown in FIG. 37. Two terminals 90 made from an electrically conductive material are prepared to produce such a two-terminal component 60. These terminals 90 are formed such that they extend from hoops 92. Practically, a plurality of terminals 90 are formed on each hoop 92 in line. A terminal 90 is provided with a fold section 94 at the intermediate portion and an H-shaped support member 96 at the end. The support member 96 is bent and is provided with a protruded mounting member 98 at the center. The two terminals 90 are disposed such that their mounting members 98 are disposed opposite to each other.

The piezoelectric resonator 10 is supported between the mounting members 98. The mounting members 98 abut against the external electrodes 20 and 22 preferably at the center of the piezoelectric resonator in the longitudinal direction. Since the terminals 90 have fold sections 94, which serve as spring elements, the piezoelectric resonator 10 is spring-supported by the terminals 90. A case 100 having an opening at one end is placed on the piezoelectric resonator 10. The opening of the case 100 is closed with paper and then resin-sealed. The terminals 90 are cut from the hoops 92 to complete the electronic component 60. The electronic component 60 having a shape other than a chip-shape can thus be made.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric resonator comprising:
    a base member including a plurality of laminated piezoelectric layers; and
    a plurality of electrodes disposed in said base member and arranged substantially perpendicularly to a longitudinal direction of said base member and spaced at intervals in the longitudinal direction of said base member, said plurality of electrodes being disposed on surfaces of said plurality of piezoelectric layers which are substantially perpendicular to the longitudinal direction of said base member; wherein
    each of said plurality of piezoelectric layers is polarized in the longitudinal direction of said base member;
    at least one of said plurality of electrodes is formed only partially on respective surfaces of said piezoelectric layers; and
    an AC electric field is applied in the longitudinal direction of said base member to each of said piezoelectric layers via said plurality of electrodes so that longitudinal basic vibration is generated in said base member and such that a node point of the base member is defined approximately at a center of the base member.

2. A piezoelectric resonator according to claim 1, wherein said electrodes formed partially on said respective surfaces of said piezoelectric layers comprise a plurality of stripes.

3. A piezoelectric resonator according to claim 1, wherein a first group of said plurality of electrodes comprise a plurality of stripes disposed on respective surfaces of said piezoelectric layers which are substantially perpendicular to the longitudinal direction of said base member, and
    a second group of said plurality of electrodes are arranged to cover an entire area of a respective surface of said piezoelectric layers.

4. A piezoelectric resonator according to claim 1, further comprising a support member and a mounting member disposed between said support member and said base member.

5. A piezoelectric resonator according to claim 1, wherein said plurality of said electrodes comprise a plurality of stripes disposed on respective surfaces of said plurality of electrodes and a total area of said plurality of stripes for one of said plurality of electrodes is larger as the said one of said plurality of electrodes is disposed closer to a center of the base member in the longitudinal direction of the piezoelectric resonator.

6. A piezoelectric resonator according to claim 1, wherein an overlapping area of opposing portions of each of a plurality of pairs of adjacent ones of said electrodes increases as each of said pair of electrodes is disposed closer to a center of the base member than others of said plurality of electrodes.

7. A piezoelectric resonator comprising:
    a base member including an integral unit containing a plurality of laminated piezoelectric layers and a plurality of electrodes disposed in said base member on respective surfaces of said plurality of piezoelectric layers, said plurality of piezoelectric layers being polarized such that said integral unit generates longitudinal vibration and such that a node point of the base member is defined approximately at a center of the base member; wherein
    at least one of said plurality of electrodes is formed to only partially cover a surface of a respective one of said piezoelectric layers.

8. A piezoelectric resonator according to claim 7, wherein said at least one electrode formed to only partially cover said respective one of said piezoelectric layers comprises a plurality of stripes.

9. A piezoelectric resonator according to claim 8, wherein said plurality of stripes are disposed at an angle on said respective one of said plurality of piezoelectric layers.

10. A piezoelectric resonator according to claim 7, wherein a first group of said plurality of electrodes comprise a plurality of stripes disposed on surfaces of said piezoelectric layers; and a second group of said plurality of electrodes are arranged to cover an entire area of a respective surface of said piezoelectric layers.

11. A piezoelectric resonator according to claim 7, further comprising a support member and a mounting member disposed between said support member and said base member.

12. A piezoelectric resonator according to claim 7, wherein a plurality of said electrodes comprise a plurality of stripes disposed on respective surfaces of said plurality of electrodes and a total area of said plurality of stripes for one of said electrodes is larger as said one of said plurality of electrodes is disposed closer to a center of the base member than others of said plurality of electrodes.

13. A piezoelectric resonator according to claim 7, wherein an overlapping area of opposing portions of each of a plurality of pairs of adjacent ones of said electrodes increases as each of said pair of electrodes is disposed closer to a center of the base member.

14. An electronic component comprising:

a piezoelectric resonator including a base member being an integral unit containing a plurality of laminated piezoelectric layers and a plurality of electrodes disposed in said base member on respective surfaces of said plurality of piezoelectric layers, said plurality of piezoelectric layers being polarized such that said integral unit generates longitudinal vibration and such that a node point of the base member is defined approximately at a center of the base member;

wherein at least one of said plurality of electrodes is formed to only partially cover a surface of a respective one of said piezoelectric layers;

a support member including an insulating substrate;

a mounting member disposed between said support member and said base member; and a cap disposed on said insulating substrate so as to cover said base member.

15. An electronic component according to claim 14, wherein said at least one electrode formed to only partially cover said respective one of said piezoelectric layers comprises a plurality of stripes.

16. An electronic component according to claim 15, wherein said plurality of stripes are disposed at an angle on said respective one of said plurality of piezoelectric layers.

17. An electronic component according to claim 14, wherein a first group of said plurality of electrodes comprise a plurality of stripes disposed on surfaces of said piezoelectric layers; and a second group of said plurality of electrodes are arranged to cover an entire area of a respective surface of said piezoelectric layers.

18. An electronic component according to claim 14, wherein a plurality of said electrodes comprise a plurality of stripes disposed on respective surfaces of said plurality of electrodes and a total area of said plurality of stripes for one of said electrodes is larger as the layer is disposed closer to a center of the base member than others of said plurality of electrodes.

19. An electronic component comprising:

a plurality of piezoelectric resonators each including a base member being an integral unit containing a plurality of piezoelectric layers and a plurality of electrodes disposed in said base member on surfaces of said plurality of piezoelectric layers, said plurality of piezoelectric layers being polarized such that said integral unit generates longitudinal vibration and such that a node point of the base member is defined approximately at a center of the base member, wherein at least one of said plurality of electrodes is formed to only partially cover a surface of a respective one of said piezoelectric layers;

a support member supporting said plurality of piezoelectric resonators;

a plurality of base members mounted on said support member via said mounting members so as to define a ladder filter; and a cap disposed on said insulating substrate so as to cover said plurality of piezoelectric resonators.

20. An electronic component according to claim 19, wherein said support member includes an insulating substrate on which a pattern electrode is disposed.

* * * * *